United States Patent [19]
Clark et al.

[11] Patent Number: 5,937,006
[45] Date of Patent: Aug. 10, 1999

[54] FREQUENCY TRANSLATING DEVICE TRANSMISSION RESPONSE METHOD

[75] Inventors: Christopher Joseph Clark, Hermosa Beach; Andrew Alfred Moulthrop, Culver City; Michael Steven Muha, Torrance; Christopher Patrick Silva, Lomita, all of Calif.

[73] Assignee: The Aerospace Corporation, El Segundo, Calif.

[21] Appl. No.: 08/865,276

[22] Filed: May 28, 1997

[51] Int. Cl.$^6$ .............................. H04B 3/46; H04B 17/00; H04Q 1/20

[52] U.S. Cl. ......................... 375/224; 324/601; 324/615; 324/76.23; 324/76.43

[58] Field of Search ........................ 375/224; 324/76.19, 324/76.21, 76.22, 76.23, 76.29, 76.43, 76.52, 615, 639, 601; 455/67.4, 226.1, 226.4

[56] References Cited

U.S. PATENT DOCUMENTS

| | | | |
|---|---|---|---|
| 4,716,362 | 12/1987 | Ambos et al. | 324/77 B |
| 4,860,227 | 8/1989 | Tamamura | 364/553 |
| 5,038,096 | 8/1991 | Obie et al. | 324/77 B |
| 5,089,782 | 2/1992 | Pike et al. | 324/623 |
| 5,119,399 | 6/1992 | Santos et al. | 375/10 |
| 5,309,477 | 5/1994 | Ishii | 375/10 |
| 5,321,364 | 6/1994 | Nukiyama et al. | 324/601 |
| 5,337,014 | 8/1994 | Najle et al. | 324/613 |
| 5,371,760 | 12/1994 | Allen et al. | 375/1 |
| 5,724,388 | 3/1998 | Nagano et al. | 375/224 |
| 5,784,299 | 7/1998 | Evers et al. | 364/571.01 |

OTHER PUBLICATIONS

C. G. Montgomery, "Technique of Microwave Measurements", M.I.T. Radiation Laboratory Series, McGraw–Hill, New York, 1948.

IEEE Standard Test Procedures for Antennas, IEEE Std. 149–1979 Sec. 12.2.2, IEEE, Inc., NY 1979.

H. L. Berger, "Inferred MMIC Upconverter Response", TRW, Jan. 22, 1995.

Amplitude and Phase Measurements of Frequency Translating Devices using the HP 8510B Network Analyzer Produce Note HP8510–7, Hewlett–Packard Co., Sep. 1987.

"HP 71500A Microwave Transition Analyzer Group Delay personality", product Note 70820–10, Hewlett–Packard Co., Apr. 1994.

J. Dunsmore & B. Brown, Optimize Mixer Performance Through Swept Frequency and Power Characterization, RF Expo East Proceedings, Orlando, FL pp. 123–141, Oct. 29, 1991.

M. Schwartz, W. R. Bennett, S. Stein, "Communication Systems and Technique", New york, McGraw–Hill, Inc., pp. 29–45, 1966.

S. A. Maas, "Microwave Mixers", 2nd Edition, Norwood, Mass., Artech House, Inc., 1993.

National Instruments, Labview Virtual Instrumentation Software, Austin, Texas, Jan. 1996.

*Primary Examiner*—Stephen Chin
*Assistant Examiner*—Mohammad Ghayour
*Attorney, Agent, or Firm*—Derrick Michael Reid

[57] ABSTRACT

A three-pair measurement method determines the amplitude and phase transmission response of frequency translating devices including a device under test and two test devices using a vector network analyzer and a controller where one of the devices has reciprocal frequency response characteristics. The characterization of single sideband and double sideband devices such as mixers, is preferably performed by combining data from analyzer two-port swept measurements. The measurement method provides a low-pass equivalent transmission response of the devices.

20 Claims, 18 Drawing Sheets

SSB Measurement Flow Diagram

SSB FTD Test Diagram

SSB Measurement Flow Diagram

DSB FTD Test Diagram

DSB Measurement Flow Diagram

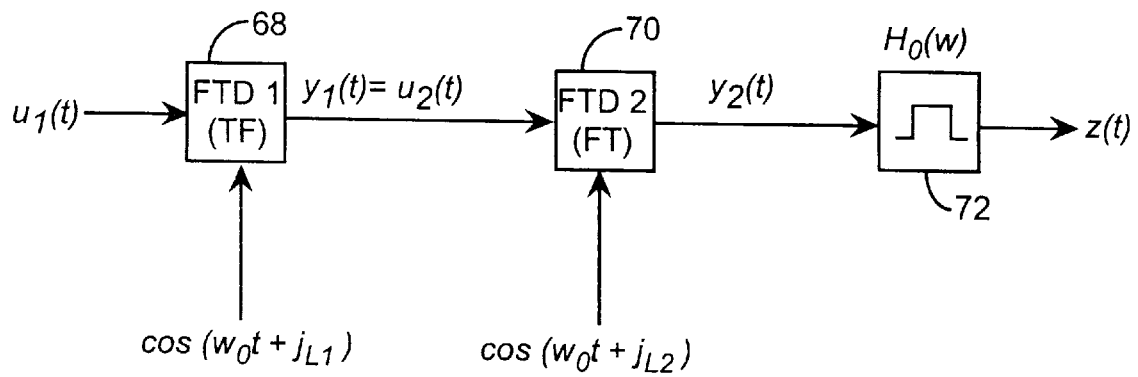
Cascade SSB & DSB Baseband Model    FIG. 5A
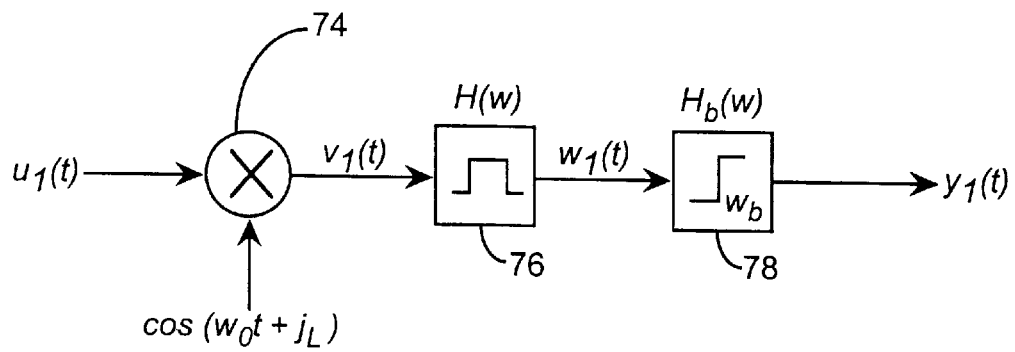
SSB TF FTD Model    FIG. 5B
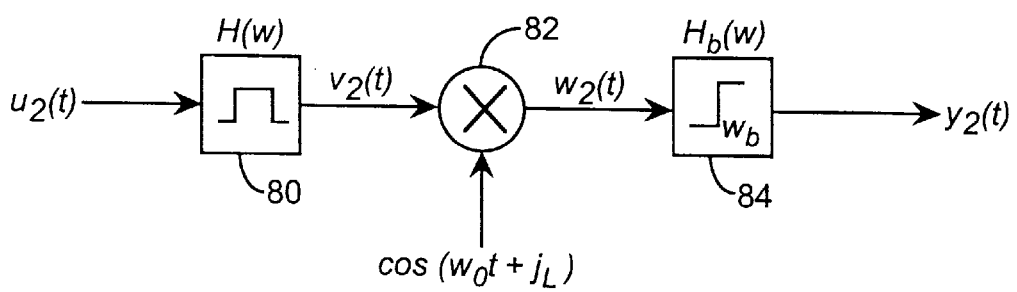
SSB FT FTD Model    FIG. 5C

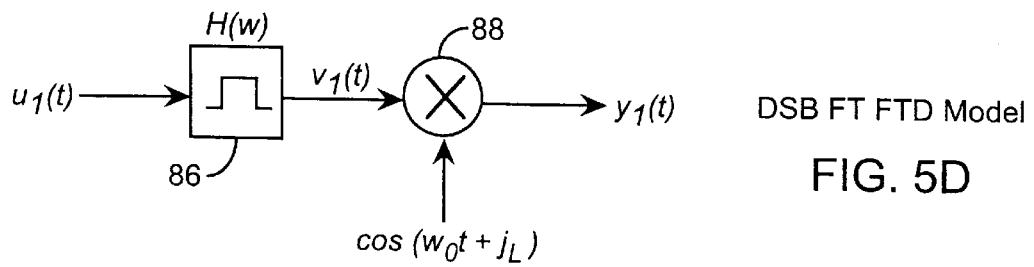
DSB FT FTD Model
FIG. 5D
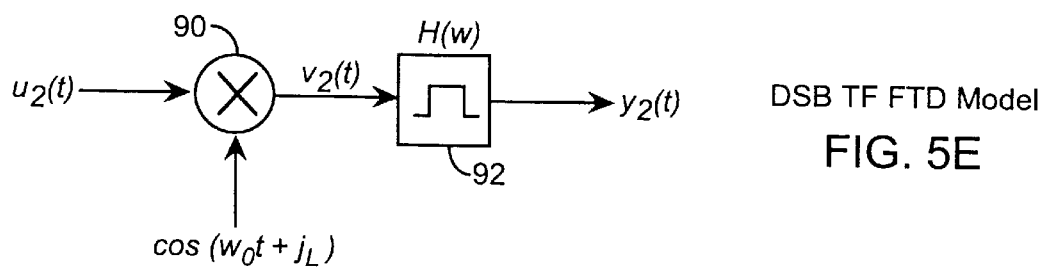
DSB TF FTD Model
FIG. 5E
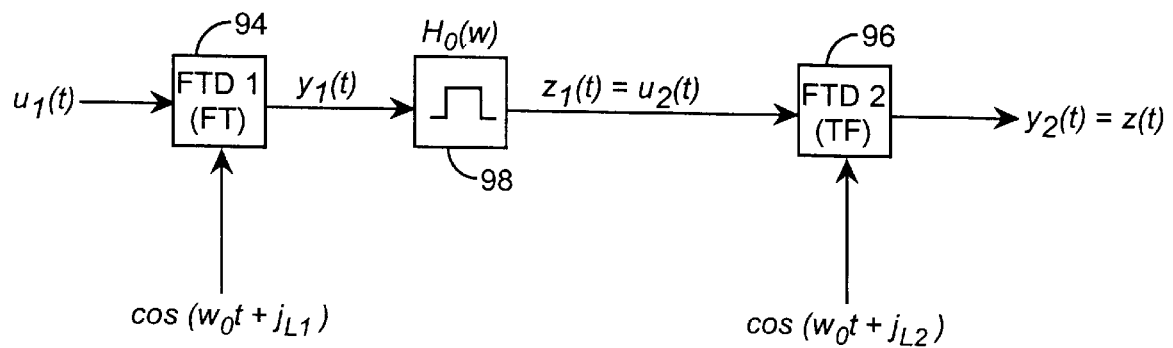
Cascade DSB RF Band Model     FIG. 6

FREQUENCY TRANSLATING DEVICE TRANSMISSION RESPONSE METHOD

STATEMENT OF GOVERNMENT INTEREST

The invention was made with Government support under Contract No. F04701-93-C-0094 by the Department of the Air Force. The Government has certain rights in the invention. The invention described herein may be manufactured and used by and for the government of the United States for governmental purpose without payment of royalty therefor.

SPECIFICATION

FIELD OF THE INVENTION

The invention relates to the field of frequency translation devices. More particularly, the present invention relates to testing procedures for determining the frequency responses of frequency translation devices.

BACKGROUND OF THE INVENTION

The measurement of the transmission response of devices in a communications channel is essential for accurate systems modeling. Both the amplitude and phase responses are needed to assess the extent of signal distortion. The most common tool for characterizing non-frequency translating devices is the vector network analyzer (VNA). Due to the VNA design and error correction capabilities, the VNA is fast and accurate. Frequency translating devices (FTDs), such as mixers, are more difficult to characterize due to the frequency offset between input and output, and cannot be measured by a VNA alone. In a typical communication channel, FTDs are often operated as single sideband (SSB) mixers in frequency converters. FTDs are also often used as double sideband (DSB) mixers in modulators and demodulators. For example, in a bi-phase shift-keying modulator, a DSB mixer is often used to convert up a baseband (BB) digital signal. VNAs have disadvantageously not been used to measure the transmission response of FTDs, such as SSB and DSB mixers.

The most common FTD measurement method uses a reference test mixer to obtain the amplitude and phase match between FTDs. A device under test (DUT) FTD is compared to a reference FTD, for example, comparing the difference of the measured response when both the DUT and reference device is an up converter FTD. This reference method is limited in that it only provides the absolute difference between FTDs over a specified frequency range. An extension of the reference method is a known gold standard method. In the known standard method, the transmission response of an FTD can be estimated relative to a known gold standard. By knowing the response of the gold standard FTD, and by measuring the difference in response between the gold standard FTD and the DUT FTD, the DUT FTD response can be calculated. The disadvantage to the known standard method is that the response measurement accuracy is limited to how accurate the known standard has been characterized. Scalar network analyzers can be configured to accurately obtain the conversion loss, that is, the amplitude response, of FTDs as a response measurement. However, this scalar network analyzer method does not completely characterize an FTD because phase information is not included. Another method uses a microwave transition analyzer and an AM or FM envelope delay to characterize SSB FTDs to up to, for example, forty GHz, without the need for a standard reference nor test mixers. As a result, this microwave transition analyzer method has the additional capability of characterizing FTDs with inaccessible internal local oscillators (LOs). The microwave transition analyzer method disadvantageously cannot characterize DSB FTDs and exhibits lower measurement speed and accuracy for SSB FTDs. The transmission response measurement of DSB FTDs is not known to have been performed.

A three pair method has been used to determine the response of antennas. The three pair method measures three antennas in respective paired configurations. The result is a set of measurements from which the response of any one of the antennas can be determined. The three pair method has become standard practice for the gain calibration of antennas wherein the reciprocity property of all three antennas is required. The three pair method has been applied to the measurement of SSB FTDs but has produced inaccurate results. In general, FTDs will not operate as reciprocal devices and thus invalid results are achieved with a direct application of the three pair method. These and other disadvantages are solved or reduced using the invention.

SUMMARY OF THE INVENTION

An object of the invention is to provide a method for determining the transmission response of a frequency translating device (FTD).

Another object of the invention is to provide a method for acquiring VNA measurements of different FTDs to provide amplitude and phase responses of a single sideband (SSB) FTD.

Another object of the invention is to provide a method for measuring the amplitude and phase response of a double sideband (DSB) FTD.

Yet another object of the invention is to provide a method for performing VNA baseband swept measurements providing a phase shifted signal phase shifted from a local oscillator signal communicated respectively to up and down conversion DSB FTDs.

Still another object of the invention is to provide a method for back-to-back FTD pair VNA measurements with minimal degradation due to spurious signals.

Still a further object of the invention is to provide a method for accurately obtaining the transmission response of FTDs ranging from simple mixers to a complete communications channel with offset frequencies.

Yet a further object of the invention is to provide a method for accurately obtaining the transmission response of a device under test (DUT) FTD using a vector network analyzer and two test mixers (TM1 and TM2).

Another object of the invention is to provide a method for accurately obtaining the transmission response of the DUT FTD using a vector network analyzer, a TM1, a TM2 where one of the TM1, TM2 or DUT FTD has a reciprocal frequency response.

Yet another object of the invention is to provide a method for accurately obtaining the transmission response of DUT FTDs using a vector network analyzer, a TM1 and a TM2 where at least one of the TM1 and TM2 provide reciprocal frequency response characteristics.

The invention is a three pair method for measuring the transmission response of frequency translating devices (FTDs). The method is suitable for FTDs that range from a simple microwave mixer to a complete communications channel, such as the communications payload on a typical satellite. The method is particularly applicable to FTDs operating as either single-sideband (SSB) or double-sideband (DSB) mixers functioning as frequency converters.

The method provides a measurement of the transmission response of both the amplitude and phase frequency characteristics essential for system performance verification and accurate computer-aided simulations for communication systems design and development.

The FTDs are preferably SSB or DSB mixers but in the broadest aspect, can be any communication channel with offset frequencies. The method is preferably implemented in a test configuration using a vector network analyzer (VNA) coupled to two back-to-back FTDs designated as an up conversion frequency translating device, (up FTD), and a down conversion frequency translating device (down FTD). This test configuration includes the up FTD and down FTD as a pair of FTDs. The method preferably makes at least three pair measurements using paired combinations of three FTDs. Three FTDs designated as two test mixers TM1 and TM2 FTDs and a device under test (DUT) FTD are inserted into the up FTD and down FTD location in pairs for three separate measurements in the three pair method. At least one of TM1, TM2 and DUT FTDs is or is configured to provide reciprocal frequency response characteristics. The result is a set of VNA measurements from which the response of the FTDs including the DUT FTD can be determined.

The present three pair method requires reciprocity properties of at least one of the FTDs to determine the phase and amplitude response of the FTDs. Three test configuration measurements A, B and C are made using the TM1, TM2 and DUT FTDs. The DUT, TM1 and TM2 FTDs are inserted in the up FTD and down FTD positions of the test configuration for the three test configuration measurements A, B and C. In an exemplar preferred implementation, in measurement configuration A, the DUT is the up FTD and TM1 is the down FTD, in configuration B, DUT is the up FTD and TM2 is down FTD, and in configuration C, TM1 is the up FTD and TM2 is the down FTD. One of the TM1, TM2 or DUT must be or is configured to be a reciprocal FTD that provides an identical transmission response whether used as an up FTD or a down FTD, in that, the FTD must have identical reciprocal frequency response characteristics. In the preferred form of the invention, double-balanced test mixers TM1 and TM2 are preferably used to provide the necessary response reciprocity. In the exemplar form, TM1 has the necessary response reciprocity.

The method can be applied in two preferred ways, as a DSB method or as an SSB method. The SSB method is used for determining the response of SSB mixers using a cascade baseband (BB) model or used for detecting the response of DSB mixers using a cascaded RF band model. The DSB method is used for determining the response of DSB mixers using the cascade baseband model. The DSB method or SSB method are applied depending upon the VNA RF band or baseband (BB) sweep frequency range and the SSB or DSB class of mixers used. When the VNA frequency range is chosen to be the RF band FTD frequency range, the SSB method is used for determining the response of DSB mixers using a combined lower and upper sideband sweep. When the VNA frequency range is chosen to be the baseband frequency range, the DSB method is applied to DSB mixers, and the SSB method is applied to SSB mixers both using a baseband frequency sweep. The DSB method is applied to DSB mixers using BB frequency sweeps with a local oscillator (LO) phase shifter used to phase shift a local oscillator signal between the down FTD or up FTD for frequency range phase shifting to separate the sideband outputs of the DSB mixers. The DSB method is preferred for DSB mixers but the SSB method using RF band frequencies sweeps can be applied to DSB mixers for reducing the number of required measurements. The preferred method selected for DSB mixers testing is based on achieving the best measurement accuracy with the least number of required measurements.

The preferred three pair method is a process for automated analysis that yields the transmission response of SSB or DSB FTDs. The test configuration preferably comprises a VNA, a controller, a pair of test mixers, associated filters, attenuators, and isolators, and the DUT FTD. Each test configuration comprises a pair of back-to-back cascaded up and down FTDs. The filters and attenuators are used to minimize measurement error by preventing spurious signals produced by the FTDs from corrupting the measurement. The isolators prevent signal leakage through a local oscillator (LO) path to the up FTD and down FTD. When using the SSB and DSB methods with a baseband frequency sweep, the cascaded up FTD translates up an input baseband frequency range and the cascaded down FTD then translates down back to the original input baseband frequency range. When using the SSB method within RF band frequency sweep, the cascade down and up FTDs translate down the input RF frequency range and then translate back up to the original input RF frequency range. The reciprocal device provides an identical transmission response whether used as an up converter up FTD or a down converter down FTD. The attenuators may be adjusted so that at least one of the FTDs exhibits a reciprocal transmission frequency response. The VNA is calibrated for the two-port measurements. A full two-port calibration allows for accurate measurements due to the automatic 12-term error correction capability of the preferred VNA. The method requires that the DUT FTD have an external LO input or have an internal LO output so that the VNA can perform phase coherent measurements. The preferred SSB and DSB FTD measurements can be automatically performed by a programmed controller controlling the VNA to perform the measurements using forward or reverse frequency sweeps. The programmed controller acquires measurement data from the VNA and determines a low pass equivalent (LPE) response of the FTDs including the DUT FTD.

The three pair FTD method enables accurate measurement of SSB and DSB FTDs. The method is particularly useful for characterizing both the amplitude and phase response of SSB and DSB FTDs. The exemplar SSB method can be performed quickly and accurately with only three VNA measurements using forward frequency sweeps during the three measurements A, B and C. The exemplar DSB method can be performed with only six measurements using forward frequency sweeps for the three configuration measurements A, B and C. The method is useful for manufacturers of RF/microwave test systems and can be widely used to enhance VNA test capabilities with test configurations that can be implemented by peripheral VNA equipment or incorporated into future VNA designs. These and other advantages will become more apparent from the following detailed description of the preferred embodiment.

BRIEF DESCRIPTION OF THE DRAWINGS

FIG. 5a is a cascade baseband model diagram.

FIG. 5b is an SSB TF FTD model diagram.

FIG. 5c is an SSB FT FTD model diagram.

FIG. 5d is a DSB FT FTD model diagram.
FIG. 5e is a DSB TF FTD model diagram.
FIG. 6 is a cascade RF band model diagram.

DETAILED DESCRIPTION OF THE PREFERRED EMBODIMENT

Figure 1:
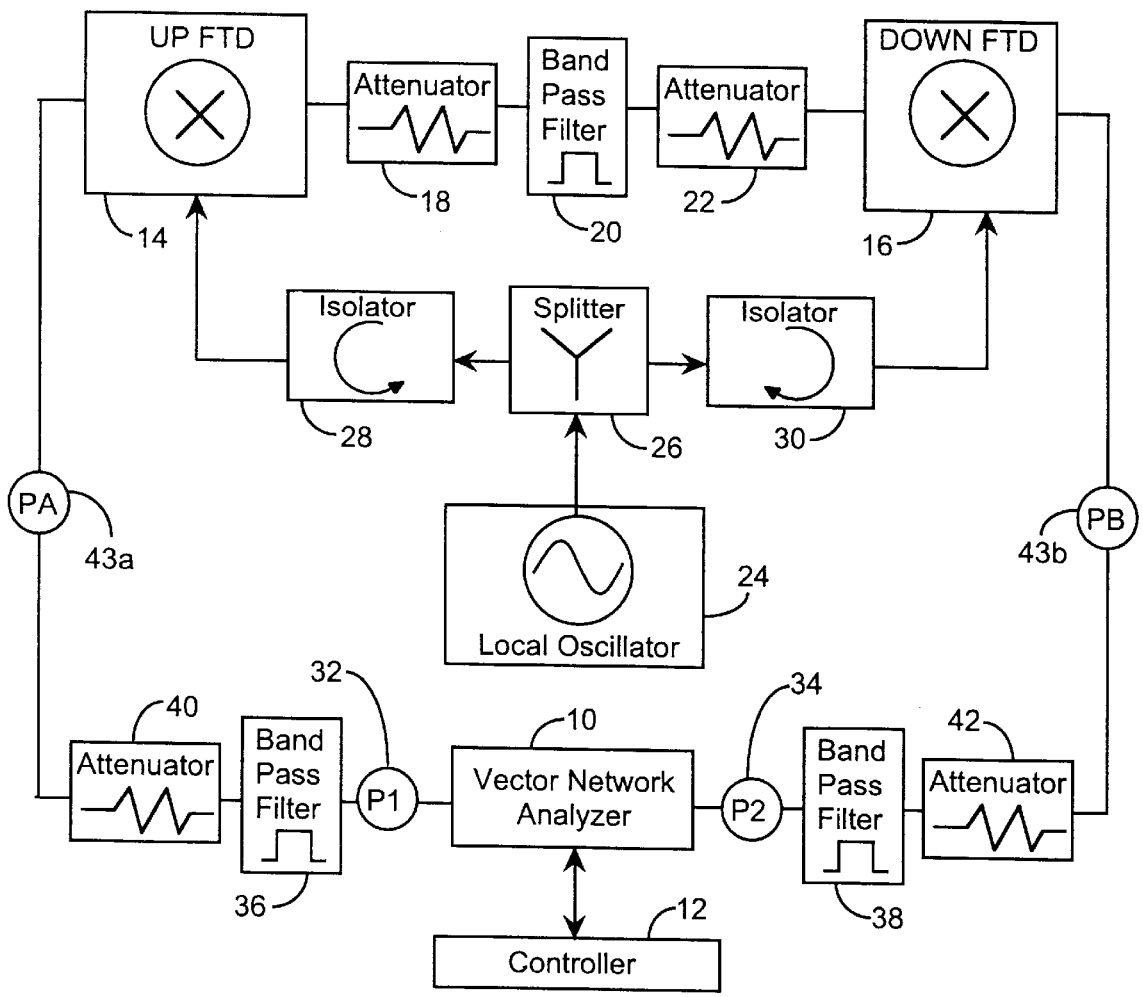
FIG. 1 is an SSB FTD test diagram.

An embodiment of the invention is described with reference to the figures using reference designations as shown in the figures. Referring to FIG. 1, a single sideband (SSB) frequency translating device (FTD) test configuration is preferably implemented using a vector network analyzer (VNA) 10 that is preferably automatically controlled by a controller 12 for measurement of the frequency response of two FTDs including an up converter FTD (up FTD) 14 and a down converter FTD (down FTD) 16, which may be for example, SSB mixers. The VNA 10 is preferably an HP8510C network analyzer and the controller 12 is preferably a National Instruments Corporation Labview (R) controller. The preferred HP8510C network analyzer 10 is capable of measurements from 0.05 to 50.0 GHz. The controller 12 performs automated measurements, control, data collection and analysis using software routines written in the preferred Labview application language to simplify the measurement procedures and reduce the possibility of operator error.

The up FTD 14 and down FTD 16 are connected in a back-to-back cascade configuration. The FTD 14 preferably functions as an up converter frequency translation device and the FTD 16 preferably functions as a down converter frequency translation device both together converting the frequency of a test signal generated by the VNA 10. A mixer typically has a lower intermediate frequency (IF) port and a higher radio frequency (RF) port. The frequency translation between the ports defines the function as either an up frequency conversion or a down frequency conversion. The back-to-back configuration includes the FTDs 14 and 16 connected in series to an up attenuator 18, a FTD bandpass filter 20 and a down attenuator 22. The preferred FTD mixers require a local oscillator signal which is preferably provided by local oscillator (LO) 24 connected to a splitter 26 splitting the local oscillator signal communicated through an up isolator 28 and a down isolator 30 respectively communicating the local oscillator signal to the up FTD 14 and down FTD 16. The VNA 10 has two ports P1 32 and P2 34. VNA P1 port 32 and P2 port 34 are respectively connected to a first port bandpass filter 36 and second port bandpass filter 38, respectively connected to a first port attenuator 40 and a second port attenuator 42, which provide a PA port 43a and a PB port 43b which are respectively connected to the up FTD 14 and down FTD 16. The VNA 10 provides the test signal at the P1 port 32 while sampling at the P2 port 34, or provides the test signal at the P2 port 34 while sampling at the P1 port 32, for forward and reverse frequency sweeps, respectively. The test signal at ports 32 and 34 is calibrated by the VNA 10 to provide a calibrated test signal at the PA port 43a or the PB port 43b, respectively, for the forward and reverse frequency sweeps, respectively. During a forward sweep measurement, the VNA 10 provides the test signal having a frequency sweep through the frequency band of the test signal to the PA port 43a as an input into the up converter FTD 14 that translates up the frequency of the test signal which is then communicated to the down FTD 16 and translated back down to the original frequency of the input signal as an output signal at the PB port 43b which is sampled by the VNA 10. The exemplar SSB measurements are preferably forward sweep measurements, but equivalent reverse sweep measurements could be used as well. During an equivalent reverse sweep measurement, the VNA provides the test signal to the PB port 43b as an input into the FTD 16 configured as an up converter that translates up the test signal which is then communicated to the FTD 14 configured as a down converter that translates back down the test signal to the original frequency of the test signal as an output signal at the PA port 43a which is then sampled by the VNA 10.

The filters 20, 36 and 38, and attenuators 18, 22, 40 and 42, and isolators 28 and 30 minimize measurement error. The test signal of the VNA 10 is calibrated at the PA and PB ports 43a and 43b. A PA-PB two-port calibration allows for accurate results because the VNA measurements automatically incorporate full 12-term error correction. A transfer function for each FTD pair between the PA and PB ports 43 is derived without removing voltage standard wave ratio (VSWR) effects between the up FTD 14 and the down FTD 16.

The FTDs 14 and 16 are preferably designated as a first test mixer TM1, a second test mixer TM2 or a device under test, DUT. The preferred method requires that the TM1, TM2 and DUT either has an external local oscillator input or have an internal local oscillator output so that the VNA 10 can perform phase coherent measurements. The attenuators 18, 22, 40 and 42 are adjusted to reduce reflections so that at least one of the TM1, TM2 or DUT has a reciprocal frequency transmission response. In practice, the value of attenuation is increased to achieve the desired reciprocity without degrading measurement accuracy due to signal dynamic range considerations. The attenuation of attenuators 18 and 22 is incrementally increased followed by respective forward and reverse measurement sweeps. When the forward response is the same as the reverse response, then both FTDs have been configured to be reciprocal, either one of which, or both, can be used in the preferred methods. After adjustment of the attenuators 18, 22, 40 and 42, the VNA 10 provides the calibrated test signal uniformly at the PA or PB ports 43a or 43b. During the exemplar SSB measurements, the TM1 has the required reciprocal frequency response characteristics and the three SSB BB measurements 50, 52 and 54 are forward frequency sweep measurements through either a lower or an upper sideband of the SSB mixers using the IF test signal at the PA port 43a. The IF test input signal is translated up by the up FTD 14 into an RF signal that is translated back down into the IF output signal for sampling by the VNA 10 at the PB port 43b.

The SSB test configuration is modified for RF DSB FTD measurements. The SSB FTD test configuration of FIG. 1 is used as an RF DSB test configuration when the filter 20 is replaced with a low pass filter and the FTD 14 is a down FTD and the FTD 16 is an up FTD. During the exemplar RF DSB measurements, lower and upper sideband RF forward frequency sweep A, B and C measurements 50, 52 and 54 and preferably made by the VNA providing the RF test signal to the PA port 43a and to the FTD 14 configured as a down converter generating a coupled IF signal to the FTD 16 configured as an up converter providing the RF signal as an output signal for sampling by the VNA 10 at the PB port 43b.

Figure 3:
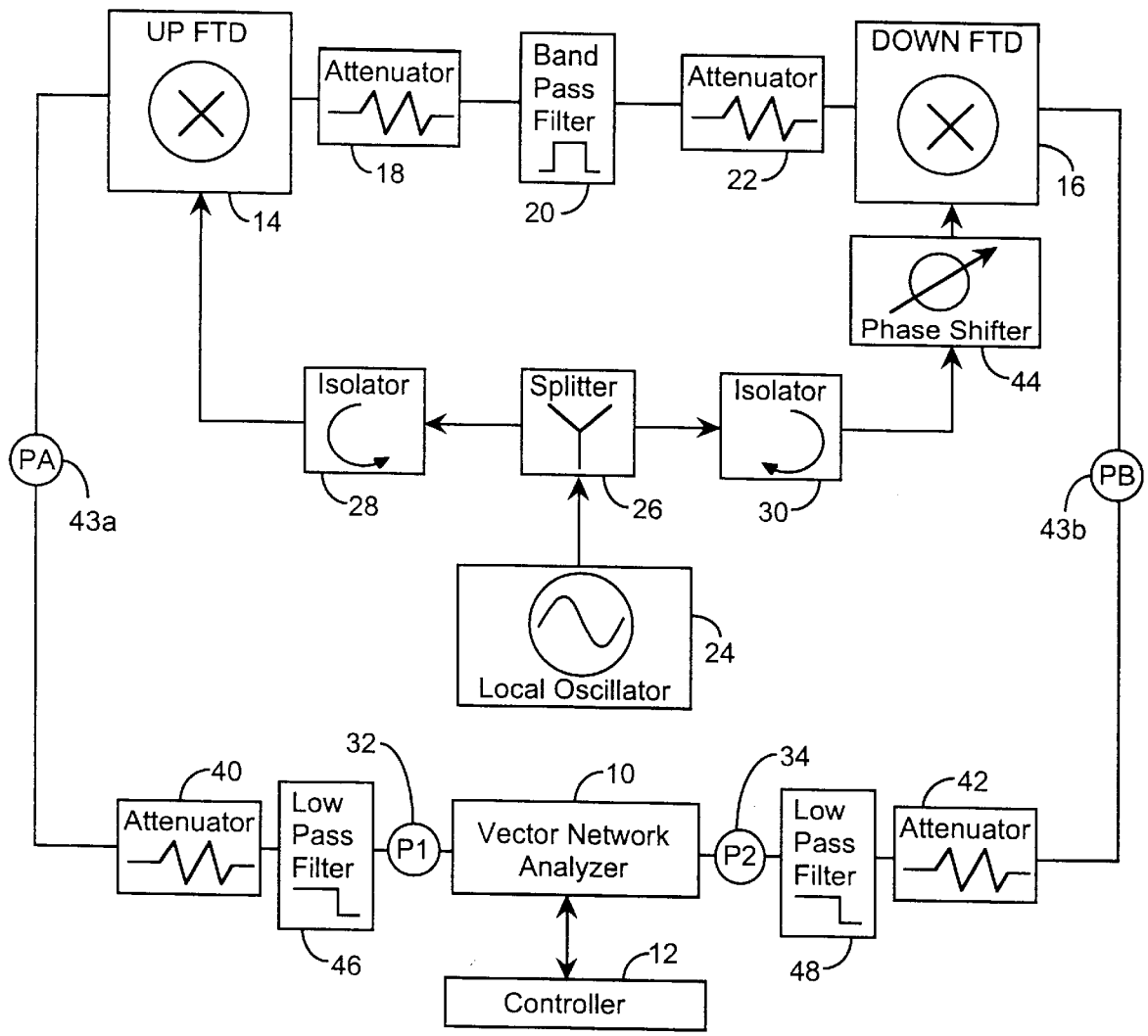
FIG. 3 is a DSB FTD test diagram.

In FIG. 3, a baseband (BB) double sideband (DSB) FTD test configuration is similar to the SSB FTD test configuration of FIG. 1. The BB DSB FTD test configuration further includes a phase shifter 44 connected between the down isolator 30 and the down FTD 16. The phase shifter 44 is used for the more accurate DSB converter FTD characterization. During the exemplar BB DSB measurements, forward frequency sweep A, B and C measurements, 60, 62 and 64 are made by the VNA 10 providing an IF input test signal at the PA port 43*a*. The IF input test signal is translated up by the up FTD 14 providing an RF signal that is translated back down by the down FTD 16 providing an IF output signal that is sampled by the VNA 10 at the PB port 43*b*. Each A, B and C measurement 60, 62 and 64 is repeated with the phase shifter 44 providing an additional ninety degree phase shift of the LO signal to the down FTD 16.

The three pair method implemented by the test configurations of FIGS. 1 and 3 can be reduced to practice using commercially available equipment. Although the preferred embodiment described here applies to SSB and DSB mixers operating at 20 GHz, similar equipment may be used to test FTDs operating at other frequencies. A Macintosh 7500 Power PC with LabView software may be used as the controller 12 to control the test and process the data. The automated procedure allows for improved speed and accuracy. For example, the local oscillator 24 may be set to 12.0 GHz, the SSB DUT may be a Watkins-Johnson MZ-5010C mixer, the VNA 10 provides a 7.8 GHz to 8.2 GHz IF test signal, and the transmission response may be obtained over a 400 MHz single sideband frequency range providing a 19.8 GHz to 20.2 GHz RF signal. The method may be performed using Watkins-Johnson MZ-5010C mixers for both TM1 and TM2. In this case, all three SSB FTDs are configured to be reciprocal devices, and eight responses for the DUT can be calculated. Higher accuracy is achieved with this implementation of the three pair method when all three FTDs have reciprocal response characteristics.

In the SSB case, preferably, the vector network analyzer 10 is a Hewlett-Packard 8510-C vector network analyzer, controller 12 is a Macintosh 7500 Power PC controller, up FTD 14 is a Watkins-Johnson MZ-5010C up FTD, down FTD 16 is a Watkins-Johnson MZ-5010C down FTD, attenuator 18 is a Hewlett-Packard 8493C-6DB attenuator, bandpass filter 20 is a K&L 5FV10-8000-T400 bandpass filter, attenuator 22 is a Hewlett-Packard 8493C-6DB attenuator, local oscillator 24 is a Hewlett-Packard 8341A local oscillator, splitter 26 is a Narda 4326B-2 splitter, isolator 28 is a TRAK 60A9201 isolator, isolator 30 is a TRAK 60A9201 isolator, bandpass filter 36 is a K&L 5FV10-20000-T4000 bandpass filter, bandpass filter 38 is a K&L 5FV10-20000-T4000 bandpass filter, attenuator 40 is a Hewlett-Packard 8493C-6DB attenuator, and attenuator 42 is a Hewlett-Packard 8493C-6DB attenuator.

For the DSB method, the FTDs 14 and 16 are preferably Watkins-Johnson M52C mixers, and bandpass filter 20 is preferably a Lark LR5500-5A low pass filter. In addition, the local oscillator 24 is set to 20 GHz, the DSB DUT may be a Watkins-Johnson M52C mixer, the VNA 10 provides a 0.045 GHz to 2.031 GHz frequency sweep test signal and the transmission response may be obtained over a 4.062 GHz baseband frequency range providing a 17.969 GHz to 22.031 GHz RF signal. The DSB method may be performed using Watkins-Johnson M52C mixers for both TM1 and TM2. For the DSB method, the bandpass filter 20 is a K&L 5FV10-20000-T4000 bandpass filter, the phase shifter 44 is a CDI 5998CCSF phase shifter, and the low pass filters 46 and 48 are Lark LR5500-5A low pass filters. When the SSB method is applied to the M52C DSB mixers, the LO is set to 20.0 GHz, the VNA 10 provides an 18.0 GHz to 22.0 GHz RF test signal, and the transmission response may be obtained over a 4 GHz RF band frequency range providing a −2.0 GHz to +2.0 GHz IF signal.

Figure 2:
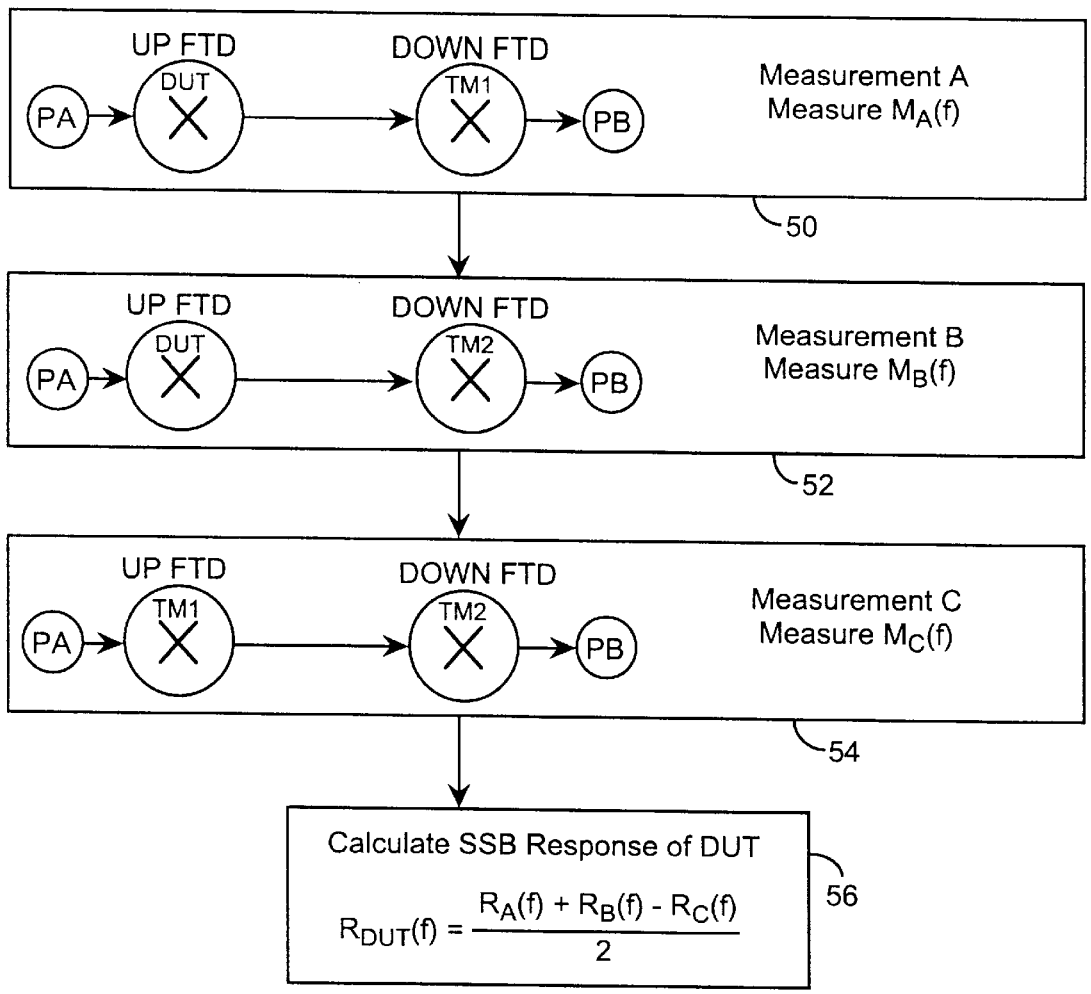
FIG. 2 is an SSB FTD measurement flow diagram.

Referring to FIGS. 1 and 2, the SSB FTD test configuration preferably enables a three pair SSB method for determining the response of a SSB device under test (DUT) FTD using the two additional FTDs, a first test mixer TM1 and a second test mixer TM2. The DUT, TM1 and TM2 FTDs are inserted by pairs into the test configuration as up FTD 14 and down FTD 16. Forward and reverse frequency sweep VNA measurements can be taken for each possible pair combination. The FTD 14 is an up converter and FTD 16 is a down converter for forward sweeps where the VNA frequency signal is applied to the up FTD 14 at the PA port 43*a* and where the VNA measures the response from the down FTD 16 at PB port 43*b*. The FTD 14 is a down converter and FTD 16 is an up converter for reverse sweeps where the VNA signal is applied to the up FTD 16 at the PB port 43*b* and where the VNA 10 measures the response from the down FTD 14 at the PA port 43*a*. The measurements include both phase and amplitude responses over a frequency bandwidth range. Measurement $M_X$ is a complex quantity including amplitude and phase and can be expressed in polar form. $R_X$ represents both amplitude and phase where $R_X = 20 \log |M_X|$ in amplitude or $R_X$ equals the angle of $M_X$ in phase.

In the exemplar SSB test configuration and method, TM1 is or is configured to be a reciprocal response FTD characterized as being tested in both the up FTD and down FTD positions for measurements A and C, respectively. Three exemplar BB SSB forward frequency sweep measurements, A measurement 50, B measurement 52 and C measurement 54, are made and then the LPE response of the DUT is calculated 56. In the A measurement 50, the DUT is the up FTD 14 and the TM1 is the down FTD 16 for the forward sweep. In the B measurement 52, the DUT is the up FTD 14 and the TM2 is the down FTD 16 for the forward sweep. In the C measurement 54, the TM1 is the up FTD and the TM2 is the down FTD 16 for the forward sweep. The A, B and C measurements 50, 52 and 54 are preferably forward sweep measurements for the exemplar DUT, TM1 and TM2 pair combination positioned in the respective test configurations. In the exemplar form of FIGS. 1 and 2, when TM1 is the reciprocal FTD, $R_A = RDUT + RTM1$ in the A measurement 50, $R_B = RDUT + RTM2$ in the B measurement 52, and $R_C = RTM1 + RTM2$ for the C measurement 54. The RDUT response is calculated in step 56 using $R_A$, $R_B$ and $R_C$ determined by the A, B and C measurements 50, 52 and 54.

Figure 4:
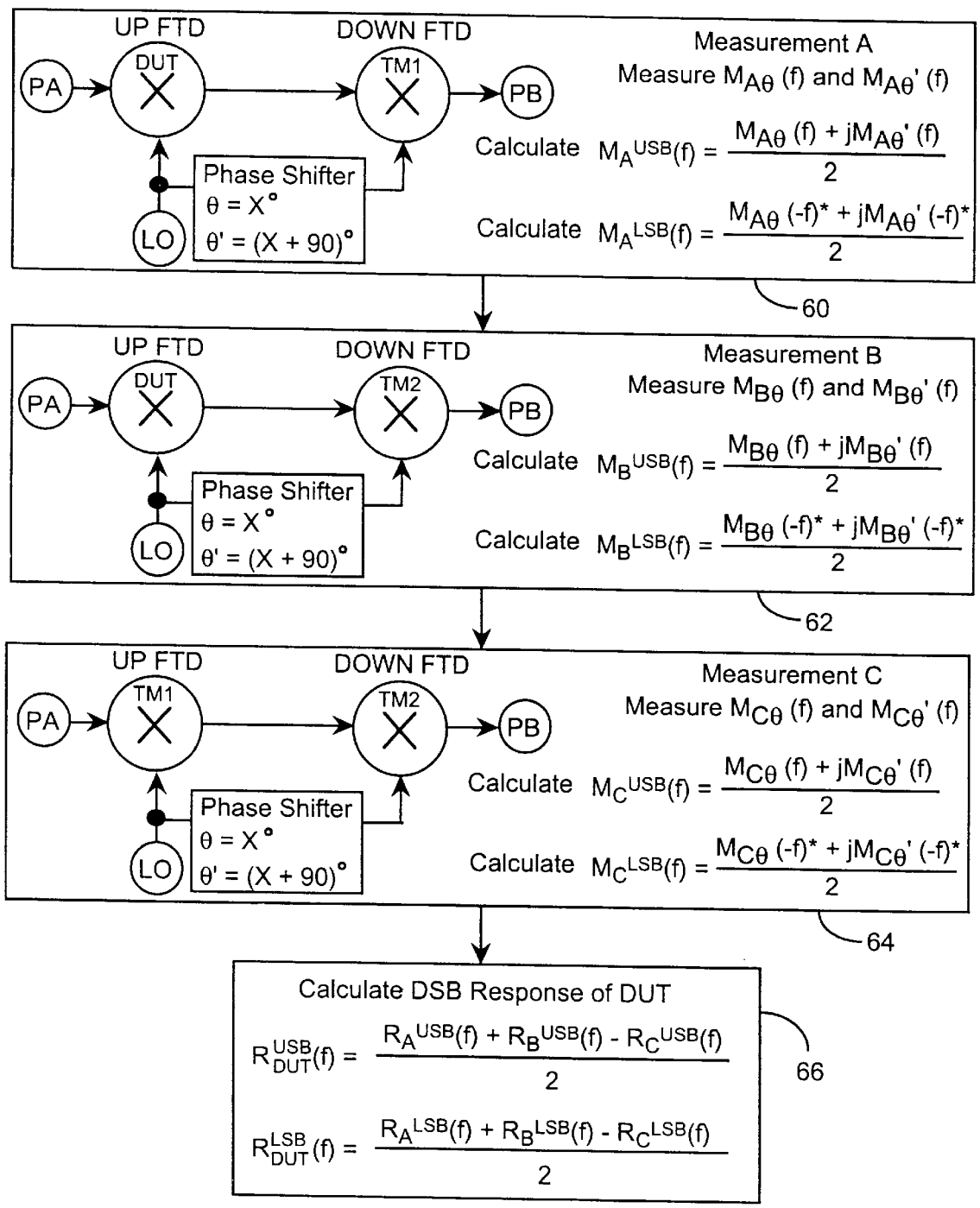
FIG. 4 is a DSB FTD measurement flow diagram.

Referring to FIGS. 3 and 4, the exemplar BB DSB FTD test configuration preferably enable a three pair DSB method for determining the response of a DSB DUT FTD using TM1 and TM2. Each measurement has two sweep measurements. A first sweep measurement $M_{X\theta}$ and a second sweep $M_{X\theta}'$. The A, B and C measurements are preferably forward baseband sweep measurements for each of the three pair combinations of the respective test configurations. Preferably, six forward baseband sweep measurements A, B and C at θ and at θ', that is, $M_{X\theta}$ and $M_{X\theta}'$ are taken after which the LPE response of the DUT is calculated. After each pair of $M_{X\theta}$ and $M_{X\theta}'$ measurements are taken, LSB and USB responses, $M_X^{LSB}$ and $M_X^{USB}$, are calculated. The LSB and USB responses $M_X^{LSB}$ and $M_X^{USB}$ are complex quantities including amplitude and phase and can be expressed in polar form. $R_X^{USB}$ and $R_X^{LSB}$ each represent both amplitude and phase responses over the frequency bandwidth range of the frequency sweep, where $R_X^{USB,LSB} = 20 \log |M_X^{USB,LSB}|$ in amplitude or $R_X^{USB,LSB}$ equals the angle of $M_X^{USB,LSB}$ in phase. In the exemplar DSB test configuration and method, TM1 is or is configured to be a reciprocal response FTD being tested as both an up FTD and down FTD for A and C measurements 60 and 64. The six exemplar BB DSB forward sweep A, B and C measurements 60, 62 and 64 each at θ and at θ' are made before the LPE response is calculated in step 66.

Referring to FIGS. 1–4, the LPE transmission response of a DUT is calculated from the measured response of the back-to-back configurations using the DUT, TM1 and TM2 pairs. The attenuators 18, 22, 40 and 42 are adjusted for termination and reciprocity. Once the attenuators 18, 22, 40 and 42 and filters 20, 36, 38, 46 and 48 are adjusted, the adjustments remain during the three A, B and C measurements 50, 52 and 54 or 60, 62 and 64. A minimum of two test mixers TM1 and TM2 and a DUT are used while additional test mixers and additional reciprocity of the FTDs can be used to improve accuracy. Two transmission responses, S21 and S12, can be taken for each measurement 50, 52 and 54, or 60, 62 and 64. The two transmission responses S21 and S12 are, respectively, forward and reverse frequency sweep responses where the VNA 10 make the S21 measurement by providing the test signal at the P1 port 32 while sampling the response at the P2 port 34, and makes the S12 measurement by providing the test signal at the P2 port 34 while sampling the response at the P1 port 32. Improved accuracy is achieved when a VNA frequency sweep measurement is performed at the lower intermediate frequencies. The lower intermediate frequency is used when the DUT FTD 14 is an up converter and the FTD 16 is a down converter having intermediate frequency ports 43 so that the measurements are taken at the lower intermediate frequency. When the FTD 14 is a down converter and the FTD 16 is an up converter, the VNA 10 measures using ports 43 at the higher RF frequency with increased noise and measurement error. The VNA 10 preferably measures at the lower of the two possible input/output FTD frequencies, that is, the intermediate frequency (IF) of the DUT, TM1 and TM2 mixers. The FTDs 14 and 16 provide several signals during translation, all but one of which is filtered by the filters 20, 36, 38, 46 and 48, passing the preferred intermediated frequency signal. Typically, either the sum or difference frequency between the VNA test signal and the local oscillator signal is communicated between the FTDs 14 and 16 through the filter 20. The exemplar configurations and methods are only representative when the DUT is an up converter FTD, and TM1 is a reciprocal device, and TM2 is a down converter FTD, but other up-down converter configurations, FTD quantity, reciprocity, and frequency ranges may be used.

Referring to FIGS. 1 and 2, the tan SSB DUT response of an SSB DUT can be determined from the measured responses of the DUT, TM1 and TM2. For SSB FTD characterization, the filters 20, 36 and 38 are bandpass filters. When two test mixers are used, three forward and three reverse sweep measurements $M_A$ $M_A'$ $M_B$ $M_B'$ $M_C$ and $M_C'$ are possible. The six SSB measurements are the forward S21 (+) and reverse S12 (−) sweep measurements for each test configuration of A, B and C measurements 50, 52 and 54. The six transfer function M measurements are $M_A$(S21):DUT-TM1; $M_A'$(S12):TM1-DUT; $M_B$(S21):DUT-TM2; $M_B'$(S12):TM2-DUT; $M_C$(S21):TM1-TM2; and $M_C'$(S12):TM2-TM1, where $M_X=M_X(f)$ for X=A, B or C, representing the measured transfer functions. When TM1 is configured to be at least one required reciprocal FTD, the response of the DUT, within a fixed offset, is determined by two equations, $R_1DUT=[R_A+R_B-R_C]/2$ and $R_2DUT=[R_A'+R_B'-R_c']/2$, where $R_X$ is a function of frequency, $R_X(f)$, and represents the amplitude in dB or phase in degrees portion of the corresponding total measured response $M_X$.

When the DUT and both test mixers TM1 and TM2 have reciprocal frequency response characteristics, eight possible responses of the DUT can be determined from the six measurements. When the DUT, TM1 and TM2 have reciprocity, eight responses can be calculated to within a fixed phase offset using eight RDUT equations: $R_nDUT\{n=1-8\}=[R_A:R_A'+R_B:R_B'-R_C:R_C']/2$. The $R_nDUT$ calculation is determined for both phase and amplitude. RDUT is also a function of frequency, RDUT(f). SSB RDUT is the calculated low pass equivalent (LPE) response of the DUT. $R_X:R_X'$ is a selection of one of the responses, $R_X$ or $R_X'$ for x equal to the test configuration measurement A, B or C, where x' represents the exchange of the FTDs in their back-to-back configuration compared to the x case, which is equivalent to performing a reverse frequency sweep without an FTD exchange. Test measurement $M_A$ has the DUT in the up FTD position and the TM1 in the down FTD position, and test measurement $M_A'$ would have the TM1 as the up FTD and the DUT as the down FTD. The SSB method preferably includes both phase and amplitude measurements of $M_X$ or $M_X'$ where X=A, B or C. The measurements $M_X$ or $M_X'$ include an $R_X(f)$ phase measured response and an $R_X(f)$ amplitude measured response. The $R_X$ and $R_X'$ phase and amplitude responses are used to compute the RDUT LPE response, independently, for both phase and amplitude. The SSB FTD LPE response is an RDUT response for amplitude and phase over the LPE baseband frequency range.

The RDUT SSB equation applies for the case in which the down conversion uses low side LO injection, when the LO signal frequency is lower than the frequency of the test signal, and the up conversion uses high side injection, when the LO signal frequency is higher than the test signal. For the complementary case in which the down conversion uses high-side injection and the up conversion also uses high-side injection, then RDUT(f) must be replaced by RDUT(−f) for the amplitude and −RDUT(−f) for the phase.

The application of the technique requires that at least one of the test mixers or the DUT have a reciprocal transmission response. For each non-reciprocal FTD used, there is a subsequent reduction in the number of valid responses that can be calculated from the DUT equation. For example, if TM1 is the only reciprocal device, then there is only one valid response. When there is more than one reciprocal device, the accuracy of the calculated DUT amplitude and phase responses can be increased by averaging multiple valid responses. The low pass equivalent (LPE) response is calculated from the measurements and is translated so that the DUT response is specified relative to baseband frequencies.

The SSB method requires that at least one of the FTDs have reciprocal frequency response characteristics, that is, one of the DUT, TM1 or TM2 FTDs must provide an identical transmission response whether used as an up converter up FTD or down converter down FTD. One way to verify FTD reciprocity is by determining the equality of the S21 and S12 measurements when combining two reciprocal FTDs. Most FTDs in various applications will not possess desirable reciprocity, yet can be characterized by the method. Double balanced and triple-balanced mixers exhibit reciprocity when operated linearly and having properly terminated ports. These mixers also provide high dynamic range and multi-octave bandwidth and are well suited as test mixers TM1 and TM2 with the required reciprocity that can be verified by S21 and S12 measurements.

A test system may include two known reciprocal test mixers TM1 and TM2 for purposes of production line manufacturing testing of fabricated DUT FTDs. When both TM1 and TM2 are reciprocal devices for measuring an uncharacterized DUT, two RDUT equations are used when the DUT is either an up FTD or a down FTD. $R_1DUT=[R_A+R_B-R_C]/2$ and $R_2DUT=[R_A+R_B-R_C']/2$ when the DUT is an up FTD. $R_3DUT=[R_A'+R_B-R_C']/2$ and $R_4DUT=[R_A'+R_B'-R_C]/2$ when the DUT is a down FTD.

DSB FTDs can be measured using either of the preferred DSB method or the SSB method, depending upon the VNA sweep frequency range. The SSB method uses RF measurements for testing DSB FTDs or uses BB measurements for testing SSB FTDs. The SSB or DSB method selected for DSB FTD testing is based upon FTD frequency range using either RF or baseband for the VNA sweep, respectively. In the SSB method, the RF frequency range is directly applied using the SSB test configuration of FIG. 1 except that RF bandpass filter 20 is replaced with a low pass filter between the two DSB FTDs 14 and 16 and this lowpass filter 20 has a cutoff frequency one half of the VNA swept measurement frequency range. Thus, the SSB test configuration of FIG. 1 can be applied to SSB FTDs or applied to DSB FTDs for RF band measurements with both applications using the SSB method of FIG. 2.

The more accurate DSB method of FIG. 4 for testing DSB FTDs uses the baseband FTD frequency range for the VNA sweeps using the DSB test configuration of FIG. 3. The VNA test signal is applied to one of the IF ports 43. The back-to-back FTD responses are measured at two settings of the phase shifter 44. The phase shifter settings θ and θ' are 90 degrees apart relative to the LO frequency. The two phase settings are used to characterize the DSB FTDs. The low pass equivalent (LPE) DSB response can be calculated from BB DSB measurement 60, 62 and 64 using BB DSB $M_X^{LSB}$ and $M_X^{USB}$ transfer function equations.

$$M_X(-f_c < f < 0)^{LSB} = \{M_{X\theta}(-f)^* + jM_{X\theta'}(-f)^*\}/2$$

$$M_X(0 < f < f_c)^{USB} = \{M_{X\theta}(f) + jM_{X\theta'}(f)\}/2$$

The * is the complex conjugate operation. The j is the square root of −1. The $M_{X\theta}(f)$ is the complex S21 response of the back-to-back FTDs at the first θ phase shifter setting, and $M_{X\theta'}(f)$ is the complex S21 response of the back-to-back FTDs at the second θ' phase shifter setting, with the first setting minus the second setting equaling plus or minus ninety degrees for test configurations x=A, B or C. LSB means the lower sideband and USB means the upper side band. Each exemplar measurement is repeated for each FTD pair at forward sweeps for θ and θ' settings. For each test configuration measurement A 60, B 62 and C 64, there are four possible measurements for forward and reverse sweeps and for θ and θ' phase settings, for a total of twelve measurements. The low pass equivalent (LPE) DSB transmission response of the back-to-back FTD pairs is the BB DSB transfer function within a fixed phase offset. The LPE DSB response of the DUT is calculated by applying the RDUT equation to the upper and lower sideband of $M_X(f)$ independently. Method steps 60, 62, 64 and 66 of FIG. 4 are for DSB characterization for when the VNA forward sweep is performed at baseband. The exemplar DSB method includes both phase and amplitude measurements for $M_{X\theta}$ and $M_{X\theta}'$ for X=A, B and C. Steps 60, 62 and 64 also calculate the $M_X^{USB}$ and $M_X^{LSB}$ responses independently for amplitude and phase. The $RDUT^{LSB}$ and $RDUT^{USB}$ responses are calculated independently for amplitude and phase as a complete LPE response over the relative baseband in step 66.

In the exemplar DSB method, the baseband VNA output IF signal at the A port 43a mixes with the LO in the up FTD to produce both USB and LSB signals. Both sidebands are down converted in the down FTD back into the baseband IF frequency at the sampling B port 43b. The sidebands recombine at any relative phase, based on the setting of the phase shifter 44. For example, if one setting of the phase shifter 44 gives a maximum IF signal at an IF frequency, then a setting 90 degrees away will give a minimum IF signal. At the maximum IF signal, the two sidebands are in-phase, so the IF response is the sum of the two sideband responses. At the minimum IF signal, the sidebands are out-of-phase, so the IF response equals the difference of the two sideband responses. It is unnecessary to find the maximum IF response. Any two phase settings 90 degrees apart are sufficient. Once the $M_X^{USB}$ and $M_X^{LSB}$ measurement responses of the DSB FTD are calculated using the DSB de-embedding equations in steps 60, 62 and 64, the DUT response RDUT can be calculated in step 66 for each sideband independently.

The preferred test configurations implementing the SSB and DSB methods can minimize measurement errors. A first test consideration is port termination sensitivities of the FTDs. Stand alone mixers will often require special care in contrast to frequency converter units where isolation is often provided by filters, isolators, or amplifiers. The preferred measurement method does not correct for errors due to voltage standing wave ratio (VSWR) interaction between the FTDs. Consequently, the VSWR of the test mixers should be low. In addition, many broadband mixers are especially sensitive to reactive port terminations. The IF ports 43 are particularly sensitive because unwanted mixing products can be reflected back into the mixer generating erroneous secondary IF signals. Broadband resistive attenuators 18 and 22 placed between the up FTD 14 and down FTD 16 serve to minimize VSWR interaction, as well as terminate spurious mixing products. The attenuation value required is based on the specific characteristics of the FTDs 14 and 16 and termination is typically between six and ten dB. Where attenuation loss is excessive for proper VNA measurements, broadband isolators, diplexers, or constant impedance filters may be used instead of the attenuators 18 and 22.

The RF filter 20 between the up FTD 14 and down FTD 16 is required to remove by filtering the unwanted mixing products. These spurious responses generated by the up FTD mixer 14 would otherwise interact in the down FTD mixer 16 resulting in measurement error. The filter bandwidth should be wider than the desired response bandwidth yet narrow enough to adequately reject the largest spurious signals. The response of the filter 20 between the FTDs 14 and 16 and accompanying attenuators 18 and 22 are included in the measurement and can be removed mathematically. The filters 36 and 38, or 46 and 48 on the VNA P1 P2 ports 32 and 34 prevent spurious products generated by the mixers 14 and 16 from causing measurement error within the VNA. The response of these filters 36 and 38, or 46 and 48, and accompanying attenuators 40 and 42 can be removed by a calibration process.

To make a SSB FTD measurement using the SSB method, a SSB FTD DUT is selected, for example, a 20.0 to 8.0 GHz SSB FTD DUT down converter. An HP 8510C VNA using a full two-port calibration performs the measurements. Low-side LO injection is used with a LO frequency, for example, 12.0 GHz. The measurement bandwidth can be large, for example, 400 MHz, and many measurement points taken at respective frequency points through the band, for example, 801 frequency points. Each measurement sweep may be repeated, for example, eight times so that at each frequency point, an averaging factor, such as eight, is implemented. For the test mixers TM1 and TM2, two triple-balanced mixers, Watkins-Johnson Model WJ-MZ5010C, may be used with a 1.0 to 15.0 GHz IF and a 2.0 to 26.0 GHz RF/LO. The calculated responses for both the amplitude and phase are measured over the bandwidth, for example, over 400 MHz, to observe respective response curves of the DUT, TM1 and TM2. With reciprocal frequency response characteristics, an FTD can also be used as an up or down converter with the same frequency response.

To make DSB FTD measurements, a DSB FTD DUT is selected, for example, a 20.0 GHz to baseband down converter Watkins-Johnson WJ-M52C Mixer, or the DSB FTD DUT may be a DSB double-balanced mixer ST Microwave Model MX1026C. Two additional WJ-M52C devices may be used as test mixers. The VNA measurements can be performed at either the higher RF or lower IF baseband frequency range of the FTDs using SSB method and DSB method, respectively. The measurements may be performed by an HP 8510C VNA using full two-port calibrations. For the SSB method, the VNA RF sweep frequency range for the three measurements is 18.0 to 22.0 GHz using 401 points. For the DSB method, the VNA BB sweep frequency range for the six required measurements is 0.045 to 2.031 GHZ using 201 points. Each measurement sweep may be repeated, for example, eight times and an averaging factor, such as eight, is implemented.

The SSB method results may contain a significant amount of additional broadband noise and are also more prone to spurious noise spikes. A small amount of ripple for baseband characterization is a result of VSWR interaction and can be reduced by increasing the amount of attenuation at the mixer ports 43. With sufficient mixer port attenuation, the DSB method can provide an accurate result for DSB FTD measurements.

Small errors in the DSB method may be caused by the low-frequency skirt of the filter caused by the frequency offset of the filter bandcenter relative to the LO. This frequency offset causes the lower frequency skirt to fold on top of passband frequencies at baseband. Hence, at baseband, small amplitude signals from the lower frequency skirt interfere coherently with large amplitude signals from the filter passband. Small errors in the measurement of the large amplitude signals cause large errors in the measurement of small signals. This indicates a limitation of the baseband VNA DSB method applied to DSB FTDs. The accuracy is reduced if the difference between sidebands is more than about ten dB.

System modeling for the SSB and DSB methods is based upon a derivation of the frequency response for cascaded FTD pairs. The LPE transmission response is calculated for a DUT from a set of linear algebraic equations and the measurements of cascaded up and down FTD pairs. The cascade BB SSB model uses up and down FTD SSB models and the cascade BB DSB model uses up and down DSB FTD models.

FIG. 5a presents the cascade baseband model used for the SSB and DSB methods. The cascade BB model includes a translator filter (TF) up FTD 68, a filter translator (FT) down FTD 70 and an ideal harmonic filter 72. The harmonic filter 72 is ideal over the baseband used, and as such, the frequency content of an output z(t) is in an untranslated and filtered form of the input $u_1(t)$. The cascade baseband model represents an accurate measurement configuration because the VNA sweeps at the lower baseband frequency range of the FTDs. The cascade BB model is shown in a TF up FTD to FT down FTD configuration as in FIGS. 1 and 3.

FIGS. 5b and 5c respectively depict the basic FTD models 68 and 70, respectively, when modeled as SSB FTDs. The SSB FTD model 68 consists of a perfect frequency translator 74, a bandpass filter 76 that represents the FTD transmission response characteristics, and an ideal brickwall filter 78. The SSB FTD model 70 consists of a bandpass filter 80 that represents the FTD transmission response characteristics, a perfect frequency translator 82, and an ideal brickwall filter 84. For the upper sideband USB case, the brick wall filters 78 and 84 are high pass filters, as shown. For the lower sideband LSB case, the brickwall filters 78 and 84 are low pass filters.

FIGS. 5d and 5e depict the FTD models 68 and 70, respectively, when modeled as DSB FTDs. The DSB FTD model 68 consists of a bandpass filter 86 followed by a perfect frequency translator 88. The DSB FTD model 70 consists of a perfect frequency translator 90 followed by a bandpass filter 92. The bandpass filters 86 and 92 for the DSB FTD models 68 and 70 represent the FTD transmissions response characteristics of the DSB FTDs.

FIG. 6 shows a cascade RF model used for the SSB method where an FTD 94 is the down FTD, FTD 96 is the up FTD, and the filter 98 is an ideal harmonic filter. The RF cascade model is shown in an FT to TF order. The TF up FTD models 68 and 96 are up FTDs that perform lowpass to band pass frequency translation for DSB FTDs, or band pass to band pass frequency translation for SSB FTDs. The FT down FTD models 70 and 94 are down FTDs with band pass to low pass frequency translations for DSB FTDs, or band pass to band pass frequency translations for SSB FTDs. Harmonic filter 72 is a baseband filter. Harmonic filter 98 is a low pass filter. In both FIG. 5a cascaded BB models and FIG. 6 RF models, two separate local oscillators $\cos(\omega_0 t + \phi_{L1})$ and $\cos(\omega_0 t + \phi_{L2})$ are coherently locked to the same frequency $\omega_0$. The differing phases $\phi_{L1}$ and $\phi_{L2}$ may be caused by path discrepancies between the master oscillator and the two FTD LO inputs. Both cascade BB and RF models can be used for bandpass to bandpass translations. The band limited input signal $u_1(t)$ is either a baseband signal with a bandwidth $B_u$ for the TF models 68 and 96, or is a bandpass signal centered at $\omega_u$ with a bandwidth of $B_u <= \omega_u$ for both TF or FT models 68, 70, 94, and 96. The perfect frequency translators 74 and 82 for SSB FTD models, and, frequency translators 88 and 90 for the DSB FTD models are ideal multipliers and provide frequency translation. For the TF models and 96, the frequency translators 74 and 90 provide frequency translation to the frequency $\omega_0$ for the baseband input $u_1(t)$ where $\omega_0$ is $>=B_u$ for the LSB case, and provide frequency translation to the frequency $\omega_0 \pm \omega_u$ for bandpass input $u_1(t)$ signal where ± indicates either USB or LSB. For the FT models 70 and 94, the frequency translators 82 and 88 provide frequency translation to the frequency $\omega_0 \pm \omega_v$ for the bandpass $v_1(t)$ and $v_2(t)$ signals. For all FT models 70 and 94 and TF models 68 and 96, the constant $\phi_{L1}$ and $\phi_{L2}$ represents arbitrary phases of the local oscillator relative to time t=0, and covers possible phase differences of the local oscillator signal to the up and down FTDs. The ideal multipliers 74 and 90, respectively, provide the translated bandpass output signals $v_1(t)$ and $v_2(t)$ to $H(\omega)$ bandpass filters 76 and 92 for the TF models 68 and 96, respectively. The ideal multiplier 82 and 88, respectively, receive the translated bandpass output signals $v_1(t)$ and $v_2(t)$ from the $H(\omega)$ bandpass filters 80 and 86 for the FT models 70 and 94. The $H(\omega)$ bandpass filters 76 and 80 are centered at $\omega_h$ with single sided bandwidth $B_h$ that, respectively, filters $v_1(t)$ and $v_2(t)$ for the TF models 68 and 96 or the inputs $u_2(t)$ and $u_1(t)$, respectively, for the FT models 70 and 94. The bandpass filters 76, 80, 86, and 92 represent an essential frequency response characteristic of the FTDs 68, 70, 94, and 96. The translated filtered bandpass output signals $w_1(t)$ and $w_2(t)$ are, respectively, the outputs of the $H(\omega)$ bandpass filters 76 for the TF model 68, or is the output of the ideal multiplier 82 of the FT model 70. The $H_b(\omega)$ brickwall filters 78 and 84 are centered at $\omega_b$ and are used to remove one of the sidebands of the DSB output from either the $H(\omega)$ bandpass filter 76 of the TF model 68, or the $w_2(t)$ signal from the ideal multiplier 82 of the FT model 70. That is, $H_b(\omega)=1$, $|\omega|>=\omega_b$; $0$, $|\omega|<\omega_b$ for the USB case or, $H_b(\omega)=1$, $|\omega|>\omega_b$ for the LSB case. The $H_b$ filters 78 and 84 are either an ideal high-pass filter for the USB case or an ideal low pass filter for the LSB case. The output signals $y_1(t)$, $y_2(t)$, $y_1(t)$ and $y_2(t)$, respectively, of the FTDs 68, 70, 94, and 96 may be either baseband for the FT models 94 and 70, bandpass for either FT models 94 and 70 or TF models 68 and 96, with corresponding bandwidth $B_y=B_h<=B_u$.

The analysis for each of the SSB or DSB FTDs is based on LPE signals and systems. For a general real signal $x(t)$ providing a Fourier transform $X(\omega)$, the analytic signal or preenvelope of $x(t)$ is defined by the complex signal $z_x(t)$.

$$z_x(t):=x(t)+j\hat{x}(t)$$

$$\hat{x}(t)=H[x(t)]=x(t) \circledast 1/(\pi t)$$

$$\hat{x}(t) = 1/\pi \int_{-\infty}^{+\infty} x(\tau)/(t-\tau)d\tau$$

The $\hat{x}$ function is the Hilbert transform H of $x(t)$. The $\circledast$ denotes the convolution operator. In the frequency domain, the transform of $z_x(t)$ is $Z_x(\omega)=2X(\omega)U(\omega)$ and the transform of $\hat{x}(t)$ is $\hat{x}(\omega)=-jX(\omega)\text{sgn}(\omega)$, respectively, where $U(\omega):=1$, $\omega>=0$; $0$, $\omega<0$ is the unit step function, and $\text{sgn}(\omega):=1$, $\omega>=0$; $-1$, $\omega<0$ is the signum function. The signal $x(t)$ is a bandpass signal with double-sided bandwidth $2B_x$ and centered at $\omega_x>=B_x$ for positive $\omega$. The frequency $\omega_0$ is a reference frequency such that $\omega_x-B_x<\omega_0<\omega_x+B_x$, that is, $\omega_0$ falls within the bandwidth of $X(\omega)$, and satisfies the $\omega_0$ condition $\omega_0>=(\omega_x+B_x)/2$. The reference frequency $\omega_0$ is usually chosen to be the center frequency $\omega_x$ for simplicity and because the $\omega_0$ condition will be satisfied. A general case of $\omega_0$ for the FTD bandpass filters is desired because the center frequency $\omega_h$ need not equal the LO frequency $\omega_0$ that will be the chosen as the reference frequency. As defined, $z_x(t)$ can be expressed as a function of a Fourier transform. The signal $\tilde{x}(t)$ is the LPE signal or the complex envelope of $x(t)$ with respect to the reference frequency $\omega_0$. The Fourier transform $\tilde{X}(\omega)$ of $\tilde{x}(t)$ can be expressed. For an LPE system, $x(t)$ is used and $h(t)$ is the real impulse response of a linear system corresponding to a general bandpass filter $H(\omega)$.

$$z_x(t):=\tilde{x}(t)e^{j\omega_0 t}$$

$$\tilde{x}(t):=z_x(t)e^{-j\omega_0 t}$$

$$\tilde{x}(\omega)=Z_x(\omega+\omega_0)=2X(\omega+\omega_0)U(\omega+\omega_0)$$

$$H(\omega)=A_h(\omega)e^{j\phi h(\omega)}$$

The double-sided bandwidth $2B_h$ of $H(w)$ is centered at $\omega_h>=B_h$ and intersects the support of $X(\omega)$, that is, where it is not zero, and has amplitude and phase components $A_h(\omega)$ and $\phi_h(\omega)$, respectively. The $y(t)$ signal is the bandpass output of the system. The $\omega_0$ reference frequency lies in the supports of the $X(\omega)$ and $H(\omega)$ signals satisfying the $\omega_0$ condition for both $X(\omega)$ and $H(\omega)$ spectrums. For the original bandpass system, the $y(t)$ output is expressed as $y(t)=h(t) \circledast x(t)$, or, $Y(\omega)=H(\omega)X(\omega)$ and is the equivalent to the LPE system $\tilde{y}(t)$. $\tilde{H}(\omega)$ is the LPE filter referenced at $\omega_0$.

$$\tilde{y}(t)=(\tfrac{1}{2})\tilde{h}(t) \circledast \tilde{x}(t)$$

$$\tilde{Y}(\omega)=(\tfrac{1}{2})\tilde{H}(\omega)\tilde{X}(\omega)\tilde{H}(\omega)=Z_h(\omega+\omega_0)=2H(\omega+\omega_0)U(\omega+\omega_0)$$

The LPE filter $\tilde{H}(\omega)$ can be asymmetrical about $\omega=0$ in general, and hence will give rise to a complex impulse response $\tilde{h}(t)=p(t)+jq(t)$ where the real part $p(t)$ and imaginary part $q(t)$ of $\tilde{h}(t)$ are called the in-phase and quadrature components, respectively. The LPE filter $\tilde{H}(\omega)$ can also be decomposed as $\tilde{H}(\omega)=P(\omega)+jQ(\omega)$ where $P(\omega)$ and $Q(\omega)$ would represent the in-phase and quadrature components of $\tilde{H}(\omega)$, respectively, and are given by $P(\omega)=[\tilde{H}(\omega)+\tilde{H}^*(-\omega)]/2$ and $Q(\omega)=[\tilde{H}(\omega)-\tilde{H}^*(-\omega)]/2j$, where $\tilde{H}^*(\omega)$ denotes the complex conjugate of $\tilde{H}(\omega)$. Both of these $\tilde{H}(\omega)$ and $\tilde{H}^*(\omega)$ filters have amplitude components which are even functions of $\omega$ and phase components which are odd functions of $\omega$ because the amplitude and phase components correspond to real impulse responses.

The bandpass signal $x(t)$ may be specialized to an amplitude and phase modulated signal in the two equivalent forms of the $x(t)$ signal. A first modulated $x(t)$ equation can be expressed as a function of $x_p(t)$. A second modulated $x(t)$ equation can be expressed as a function of $A_x(t)$ $$x(t)=x_p(t) \cos(\omega_0 t+\phi_0)-x_q(t) \sin(\omega_0 t+\phi_0)$$

$$x(t)=A_x(t) \cos[\omega_0 t+\phi_0+\phi_x(t)]$$

The phase angle $\phi_0$ is an arbitrary constant. The signals $x_p(t)$, $x_q(t)$, $A_x(t)$ and $\phi_x(t)$ are band limited signals with bandwidth $B<=\omega_0$.

$$|A_x(t)|=[x_p^2(t)+x_q^2(t)]^{1/2}$$

$$\phi_x(t)=\arctan[x_q(t)/x_p(t)]$$

$$x_p(t)=A_x(t) \cos[\phi_x(t)]x_q(t)=A_x(t) \sin[\phi_x(t)]$$

The response $y(t)$ of a general bandpass filter to the first modulated signal $x(t)$ can be expressed in terms of convolutions. Outputs $\tilde{y}_p(t)$ and $\tilde{y}_q(t)$ are formed by the convolution operations of $x_p(t)$ and $x_q(t)$ with the real components $p(t)$ and $q(t)$ of the complex filter impulse response $\tilde{h}(t)$.

$$y(t)=(\tfrac{1}{2})[\tilde{y}_p(t) \cos(\omega_0 t+\phi_0)-\tilde{y}_q(t) \sin(\omega_0 t+\phi_0)]$$

$$\tilde{y}_p(t)=x_p(t) \circledast p(t)-x_q(t) \circledast q(t)$$

$$\tilde{y}_q(t)=x_q(t) \circledast p(t)+x_p(t) \circledast q(t)$$

Equivalent convolutions with $A_x(t)$ and $\phi_x(t)$ can also be obtained. For the special case of the second modulated signal $x(t)$ in which $\phi_x(t)=:\phi_x=$constant, the filter response is $y(t)$ which is a function of $\tilde{y}_p(t)$ and $\tilde{y}_q(t)$.

$$y(t)=(\tfrac{1}{2})[\tilde{y}_p(t) \cos(\omega_0 t+\phi_0+\phi_x)-\tilde{y}_q(t) \sin(\omega_0 t+\phi_0+\phi_x)]$$

$$\tilde{y}_p(t)=A_x(t) \circledast p(t)$$

$$\tilde{y}_q(t)=A_x(t) \circledast q(t)$$

The output $y(t)$ of the general filter $H(\omega)$ to the input $x(t)=\cos(\omega_s t+\phi_x)$, $\phi_x=$constant can be expressed in the time or frequency domain.

$$y(t)=h(t) \circledast x(t)$$

$$y(t)=A_h(\omega_s) \cos[\omega_s t+\phi_x+\phi_h(\omega_s)]$$

$$Y(\omega)=H(\omega)X(\omega)F\{\cos(\omega_s t+\phi_x)\}$$

$$Y(\omega)=H(\omega_s)e^{j\phi_x}F\{\cos(\omega_s t)\},$$

$$F\{f(t)\}=:F(\omega):=\int_{-\infty}^{+\infty}f(t)e^{j\omega t}dt$$

F{ } represents the Fourier transform operator defined through F{f(t)} for any function f(t) for which the definite integral is well defined. A similar result holds for the case of a sine function used instead in x(t) using the F{sin($\omega_s$t)}=−jF{cos($\omega_s$t)} quadrature relation.

The VNA utilizes a swept tone as its stimulus signal for probing a DUT. As such, the input $u_1(t)$ to the cascaded FTD models in FIGS. 5a and 6 can be taken to be, without loss in generality, the signal $u_1(t)=\cos(\omega_s t)$ where $\omega_s>=0$ is the probing frequency. The output z(t) is expressed as a modulated version of $u_1(t)$, thus allowing for the identification of the transmission response of the cascaded FTDs that is characterized by the product $H_1(\omega)H_2(\omega)$ or its LPE counterpart $\tilde{H}_1(\omega)\tilde{H}_2(\omega)$.

Referring to FIGS. 5a, 5b and 5c, the output of the multiplier 90 is $v_2(t)=\cos(\omega_s t)\cos(\omega_0 t+\phi_{L1})$. The $v_2(t)$ signal here is in the form of the second modulated signal x(t) with $A_x(t)=\cos(\omega_s t)$, $\phi_0=0$ and $\phi_x(t)=\phi_{L1}$. The special case of x(t) described as an amplitude and phase modulated signal results in the output $y_1(t)$ of the bandpass filter $H_1(\omega)$ expressed terms of its LPE $\tilde{H}_1(\omega)$.

$$y_1(t)=(\tfrac{1}{2})[\tilde{y}_{1p}\cos(\omega_0 t+\phi_{L1})-\tilde{y}_{1q}\sin(\omega_0 t+\phi_{L1})]$$

$$\tilde{y}_{1p}=\cos(\omega_s t)\circledast p_1(t)$$

$$\tilde{y}_{1p}=A_{p1}(\omega_s)\cos[\omega_s t+\phi_{p1}(\omega_s)]$$

$$\tilde{y}_{1q}=\cos(\omega_s t)\circledast q_1(t)$$

$$\tilde{y}_{1q}=A_{q1}(\omega_s)\cos[\omega_s t+\phi_{q1}(\omega_s)]$$

$$\tilde{H}_1(\omega)=P_1(\omega)+jQ_1(\omega)$$

$$\tilde{H}_1(\omega)=A_{p1}(\omega)e^{j\phi_{p1}(\omega)}+jA_{q1}(\omega)e^{j\phi_{q1}(\omega)}$$

In a similar manner with FTD 70 with $\omega_s$ satisfying the $\omega_s$ condition of $0<=\omega_s<\omega_0/2$, the output z(t) of the ideal harmonic filter 72 that filters out the harmonics at $2\omega_0\pm\omega_s$ is the z(t) signal.

$$z(t)=(1/16)\{A_{p1p2}[\cos(\omega_s t-\Delta\phi_L+\phi_{p1p2})+\cos(\omega_s t+\Delta\phi_L+\phi_{p1p2})]-$$
$$A_{q1q2}[\cos(\omega_s t-\Delta\phi_L+\phi_{q1q2})+\cos(\omega_s t+\Delta\phi_L+\phi_{q1q2})]-$$
$$A_{q1p2}[\sin(\omega_s t-\Delta\phi_L+\phi_{q1p2})-\sin(\omega_s t+\Delta\phi_L+\phi_{q1p2})]-$$
$$A_{p1q2}[\sin(\omega_s t-\Delta\phi_L+\phi_{p1q2})-\sin(\omega_s t+\Delta\phi_L+\phi_{p1q2})]\}$$

$$A_{kl}:=A_k(\omega_s)A_l(\omega_s)$$

$$\phi_{kl}:=\phi_k(\omega_s)+\phi_l(\omega_s)$$

The k and l elements are of the set {p1, p2, q1, q2}. Element k is not equal to l, and $\Delta\phi_L:=\phi_{L2}-\phi_{L1}$. In the frequency domain, the measured transfer function through the test system is $M_I(\omega_s)$.

$$M_I(\omega_s):=Z(\omega_s)/F\{\cos\omega_s t\}$$

$$M_I(\omega_s)=(\tfrac{1}{16})[\tilde{H}_1(\omega_s)\tilde{H}_2(\omega_s)e^{-j\Delta\phi_L}+\tilde{H}^*_1(-\omega_s)\tilde{H}^*_2(-\omega_s)e^{j\Delta\phi_L}]$$

From the expression for $M_I(\omega_s)$, one measurement will not suffice to de-embed the desired product filter because the desired product filter $\tilde{H}_1(\omega_s)\tilde{H}_2(\omega_s)$ is generally asymmetric.

By making a second measurement of the overall transfer function with the difference angle $\Delta\phi_L$ shifted by $+\pi/2$, which would correspond to adjusting the phase shifter 44 on the LO signal in FIG. 3 by $+\pi/2$, the product filter can be extracted. The second measured transfer function through the test system is $M_{II}(\omega_s)$.

$$M_{II}(\omega_s):=M_I(\omega_s)\{\Delta\phi_L\rightarrow\Delta\phi_L+\pi/2\}$$

$$M_{II}(\omega_s)=(j/16)[\tilde{H}^*_1(-\omega_s)\tilde{H}^*_2(-\omega_s)e^{j\Delta\phi_L}-\tilde{H}_1(\omega_s)\tilde{H}_2(\omega_s)e^{-j\Delta\phi_L}]$$

Combining the $M_I(\omega_s)$ measurement with a $+\pi/2$ shifted version of the $M_{II}(\omega_s)$ measurement, and because $M_I$ and $M_{II}$ must correspond to real impulse responses that satisfy the symmetry property $M_i(\omega_s)=M^*_i(-\omega_s)$, i=I or i=II, the asymmetrical product filter is $\tilde{H}_1(\omega_s)\tilde{H}_2(\omega_s)$.

$$\tilde{H}_1(\omega_s)\tilde{H}_2(\omega_s)=8e^{j\Delta\phi_L}[M_I(\omega_s)+jM_{II}(\omega_s)];\ 0<=\omega_s<\omega_0/2$$

$$\tilde{H}_1(\omega_s)\tilde{H}_2(\omega_s)=8e^{j\Delta\phi_L}[M^*_I(-\omega_s)+jM^*_{II}(-\omega_s)];\ -\omega_0/2<\omega_s<=0$$

The product response is uniquely determined from the measurements except for the fixed phase offset $\Delta\phi_L$ expressed above. This offset is essentially of no consequence to performance evaluations, since it is the shape of the phase versus frequency that is important in these considerations.

The LPE DSB FTD transmission response is $T^{DSB}(\omega):=\tilde{H}(\phi)/4$. The ¼ factor derives from the ½ factor normally associated with LPE systems, and the ½ factor coming from perfect spectral splitting manifested in the ideal multiplier output. Hence for the cascaded FTDs the product LPE response $\Pi^{DSB}(\omega_s)$ can be expressed and is needed in a de-embedding procedure. Dropping the phase offset terms $e^{j\Delta\phi_L}$ in the $\Pi^{DSB}(\omega_s)$ relation results in the BB DSB transfer function equations.

$$\Pi^{DSB}(\omega_s):=T_1^{DSB}(\omega_s)T_2^{DSB}(\omega_s)$$

$$\Pi^{DSB}(\omega_s)=(\tfrac{1}{2})e^{j\Delta\phi_L}[M^*_I(-\omega_s)+jM^*_{II}(\omega_s)];\ -\omega_0/2<\omega_s<=0$$

$$\Pi^{DSB}(\omega_s)=(\tfrac{1}{2})e^{j\Delta\phi_L}[M_I(\omega_s)+jM_{II}(\omega_s)];\ 0<=\omega_s<\omega_0/2$$

Using the SSB method, the cascaded DSB RF model in FIG. 6 is used for determining the response of DSB FTDs using RF USB and LSB sweeps combined as a single forward sweep. A forward sweep provides the input signal $u_1(t)$ at the input of the down FTD FT 94, through filter 98 providing an output $z_1(t)$ which is the input $u_2(t)$ of the up FTD TF 96 having an output $y_2(t)$ which is also the cascade output z(t) that is sampled through an RF band. In this case, only one measured transfer function $M(\omega_s)$ is needed. The LPE DSB FTD transmission response is defined as $T^{DSB}(\omega)$ $|=\tilde{H}(\omega)/4$. The product LPE response $\Pi^{DSB}(\omega_s)$ is needed for de-embedding and is a function of $\tilde{M}(\omega_s)$ which represents the LPE of $M(\omega_s)$ that will generally not be symmetrical with respect to $\omega_s=0$.

$$\Pi^{DSB}(\omega_s)=(\tfrac{1}{2})\tilde{M}(\omega_s)e^{j\Delta\phi_L};\ -\omega_s/2<\omega_s<=\omega_s/2$$

Using the SSB method for determining the response of the DSB FTDs using the USB and LSB RF frequency sweep, de-embedding calculations such as those shown in steps 60, 62 and 64 of the DSB method are not executed because the USB and LSB are separate from each other and the response $R_x$ of each sideband is only dependent upon the response of the respective sideband sweep. Whereas, in the DSB method, the de-embedding calculations for steps 60, 62 and 64, for calculating $M_x^{USB}$ and $M_x^{LSB}$, are dependent upon the response over both sidebands requiring the de-embedding calculations to provide sideband calculated responses for each respective sideband. The SSB method can be applied to both the USB SSB FTDs and LSB SSB FTDs using the cascade and individual SSB FTD models in FIGS. 5a–c. The harmonic filter 72 has an output z(t) of the cascade BB model. When measuring USB SSB FTDs using SSB FTD models, the output z(t) is a function of $-\Delta\phi_L$ because the brickwall filters 78 and 84 are high pass filters.

$$z(t) = $$
$$(1/16)\{A_{plp2}\cos[\omega_s t - \Delta\phi_L + \phi_{plp2}] - A_{qlq2}\cos[\omega_s t - \Delta\phi_L + \phi_{qlq2}] - $$
$$A_{qlp2}\sin[\omega_s t - \Delta\phi_L + \phi_{qlp2}] - A_{plq2}\sin[\omega_s t - \Delta\phi_L + \phi_{plq2}]\}$$

Offset $\Delta\phi_L$ is the same as used in the DSB analysis. The measured transfer function $M_f(\omega_s)=:M(\omega_s)$ in this case. Only one $M(\omega_s)$ measurement is needed.

$$M(\omega_s)=(1/16)\tilde{H}_1(\omega_s)\tilde{H}_2(\omega_s)e^{-j\Delta\phi_L}$$

In view of the additional brickwall filter $H_{b2}(\omega)$ that is contained in the SSB FTD model here, the analog of $\Pi^{DSB}$ is $\Pi^{USB}$.

$$\Pi^{USB}(\omega_s)=T_1^{USB}(\omega_s)T_2^{USB}(\omega_s)$$

$$\Pi^{USB}(\omega_s)=M(\omega_s)e^{j\Delta\phi_L}; \omega_s>=0$$

The LPE USB FTD transmission response is defined as $T^{USB}(\omega):=(1/4)\tilde{H}(\omega)U(\omega)$ and $U(\omega)$ is the unit step function defined above. The product $\Pi^{USB}(\omega_s)$ is suitable for usage in the de-embedding procedure. The difference between the LSB case and the USB case is the type of brickwall filters 78 and 84 in the individual SSB FTD models. The output of the harmonic filter 72 is the signal z(t) where $\omega_s$ satisfies the new condition $0<=\omega_s<\omega_0$, so that $2\omega_0-\omega_s>\omega_s$ instead, and $\Delta\phi_L$ is as for the DSB analysis. When measuring LSB SSB FTDs using SSB models, the output z(t) has a $+\Delta\phi_L$ term because the brickwall filters 78 and 84 are low pass filters.

$$z(t) = $$
$$(1/16)\{A_{plp2}\cos[\omega_s t + \Delta\phi_L + \phi_{plp2}] - A_{qlq2}\cos[\omega_s t + \Delta\phi_L + \phi_{qlq2}] + $$
$$A_{qlp2}\sin[\omega_s t + \Delta\phi_L + \phi_{qlp2}] - A_{plq2}\sin[\omega_s t + \Delta\phi_L + \phi_{plq2}]\}$$

The measured transfer function is $M(\omega_s)$ and the product response becomes $\Pi^{LSB}(\omega_s)$.

$$M(\omega_s)=(1/16)\tilde{H}^*_1(-\omega_s)\tilde{H}^*_2(-\omega_s)e^{j\Delta\phi_L}$$

$$\Pi^{LSB}(\omega_s)=T_1^{LSB}(\omega_s)T_2^{LSB}(\omega_s)$$

$$\Pi^{LSB}(\omega_s)=M^*(-\omega_s)e^{j\Delta\phi_L}; -\omega_0<\omega_s<=0,$$

The LPE LSB FTD transmission response is defined as $T^{LSB}(\omega)=(1/4)\tilde{H}(\omega)U(-\omega)$. For both SSB cases, dropping the phase offset term $e^{j\Delta\phi_L}$ from the product responses leads to the ordinary measured transfer functions. This observation, together with the next de-embedment description justifies the claims made for the extraction of the individual LPE SSB FTD responses.

The FTD transmission response de-embedding procedure is for determining the LPE transmission response of a FTD DUT. To de-embed the LPE transmission response, with $R(\omega):=20 \log A(\omega)$ for the amplitude, $\phi(\omega)$ for the phase, where $T(\omega)=A(\omega)e^{j\Phi(\omega)}$ and $T(\omega)$ generically denotes the LPE FTD transmission response for any of the sideband cases. As a result, the product LPE transmission response $\Pi(\omega)=T_1(\omega)T_2(\omega)$ obeys the relation $R_\Pi(\omega)=R_1(\omega)+R_2(\omega)$ for both the amplitude in dB and the phase in degrees. Three product transmission responses can be measured for three FTD cascades of three distinct FTDs DUT, TM1 and TM2. The up and down references of the $R(\omega)$ response represents the up conversion or down conversion responses because these responses will only be equal if the FTD has reciprocal frequency response characteristics. The measurement procedure results in simultaneous linear algebraic equations where $R_X(\omega)$ corresponds to the amplitude or phase of $\Pi_X(\omega)$ for X=A, A', B, B', C or C'.

$$R_{DUT}^{up} + R_{TM1}^{down} = R_A(\omega)$$

$$R_{TM1}^{up} + R_{DUT}^{down} = R_{A'}(\omega)$$

$$R_{DUT}^{up} + R_{TM2}^{down} = R_B(\omega)$$

$$R_{TM2}^{up} + R_{DUT}^{down} = R_{B'}(\omega)$$

$$R_{TM1}^{up} + R_{TM2}^{down} = R_C(\omega)$$

$$R_{TM2}^{up} + R_{TM1}^{down} = R_{C'}(\omega)$$

If only one FTD is reciprocal, for example, TM1, then $R_{TM1}^{up}=R_{TM1}^{down}=:R_{TM1}$. In this case, only three of the above six relations can be used simultaneously to solve for the DUT response. $R_{DUT}^{up}=(R_A+R_B-R_C)/2$ when the DUT is used as an up converter, and $R_{DUT}^{down}=(R_{A'}+R_{B'}-R_{C'})/2$ when the DUT is used as a down converter. If TM2 was the only reciprocal FTD, a different set of three relations arrive at $R_{DUT}^{up}=(R_A+R_B-R_{C'})/2$ and $R_{DUT}^{down}=(R_{A'}+R_{B'}-R_C)/2$. If TM1 and TM2 are both reciprocal FTDS, then $R_C=R_{C'}$. As a result, four RDUT equations provide valid solutions for $R_{DUT}^{up}$ or $R_{DUT}^{down}$. Finally, if all three FTDs are reciprocal, then the four valid solutions will be augmented by $R_{DUT}^{up}=(R_A+R_{B'}-R_C)/2$, $R_{DUT}^{down}=(R_{A'}+R_B-R_C)/2$, $R_{DUT}^{up}=(R_A+R_{B'}-R_{C'})/2$, $R_{DUT}^{down}=(R_{A'}+R_B-R_{C'})/2$. When $R_{DUT}^{up}=R_{DUT}^{down}=R_{DUT}$, there will be eight valid solutions for the LPE DUT response from the $R_nDUT\{n=1-8\}$ equations. The phase offset term $e^{j\Delta\phi_L}$ is not included in the RDUT equations.

FIGS. 7a to 7d show LabView block diagrams of functions to control the measurement of S21 phase and amplitude forward sweep data from an HP 8510C Vector Network Analyzer and calculate the mixer phase and amplitude responses using the SSB method. The preferred exemplar functions of the block diagrams implement the method for determining the response of a DUT with TM1 having a reciprocal response. The amplitude array 101a contains initial amplitude data and the initial phase array 101b contains phase data. The initial values in the two arrays 101a and 101b are given by inputs 102a and 102b, respectively, and are zero. The length of each array 101a and 101b is given by inputs 103a and 103b, respectively, and are 2403 elements. These two initial arrays 101a and 101b are used as the initial values of inputs 104a and 104b. Inputs 104a and 104b are data inputs into a measurement loop 105, which is a while loop which executes over and over until T/F control 106, which is under operator control from the front panel, changes value from false to true. The value in T/F control 106 is inverted by inverter 107. A true input to the inverter 107 provides a false input to control 108 which stops execution of the measurement loop 105 providing outputs 109ab. Each time loop 105 executes, the value inputs from arrays 104ab, respectively, change to the values found at output 109ab by register shifting at the end of each iteration. The outputs 109ab are, respectively, shifted into inputs 104ab. The measurement loop 105 continues to iterate over and over as long as the input to control 108 is true. However, no action is taken during an iteration unless control 111 is true. There are only three iterations which acquire measurement data after which output 109ab contains the A, B and C measurement data. An operator inserts the FTDs into a test configuration, and toggles start a measurement control 111 from false to true to start a measurement. The input values from arrays 104ab are fed into a case structure 110 which has the start measurement control 111 having two cases, true and false, chosen under operator control. When start a measurement 111 is false, (not shown), input tunnels 112a and 113a are merely connected to output tunnels 112b and 113b, respectively. The result of the while measurement loop 105 iteration where start a measurement 111 is false is that the input values 104ab are unchanged for the next iteration. A false start measurement 111 setting invokes a waiting mode so that the operator has time to set up the hardware for an SSB method measurement. When the A measurement is taken, with control 111 set to true, a S21 measurement is stored in the arrays 104ab. During the next B measurement, after changing the test FTDs, the B measurement is also stored in the arrays 104ab. During the C measurement, after changing the FTDs, the C measurement is also stored in the arrays 104ab. All three A, B and C measurements are stored in arrays 104ab.

Hence, the SSB method has three different, yet similar, A, B C measurements of steps 50, 52, and 54, respectively, in FIG. 2. The test setups are configured and then specified by operator control by measurement control 114a. Measurement control 114a can have the assigned values zero, one, or two, selectable, respectively, for the A, B and C measurements 50, 52 and 54, respectively. Control 111 when true as shown, indicates that the operator has toggled this control when the test configuration is set up properly according to one of the three test configurations of FIG. 1 for measurements 50, 52, and 54 in FIG. 2 corresponding to the value of control 114a. When the case structure 110 is selected as true by control 111, the arrays 104ab are modified inside the case structure 110.

Case structure 110 is used for acquiring the A, B and C measurement data presented at outputs 109ab. The input arrays 104ab go into split array functions 115ab. The split functions 115ab each split the array inputs 104ab into two smaller arrays. The array element at which the split is made is determined by an input 114b and control 114a multiplied together by multiplier 114c connected to split array functions 115ab. Input 114b has the value 801 for the 8510 Vector Network Analyzer set up for an 801 point sweep. Hence, each A, B and C measurement has 801 data elements in the arrays 104ab. The array inputs 104ab have elements 0 through 2402, and the split array functions 115ab splits the arrays. If control 114a has the value of zero, then the outputs 115ce of split functions 115ab is an empty array, and the outputs 115df is the original array of elements 0 to 2402. If control 114a has the value one, the array outputs 115ce has 801 elements and contains elements 0 to 800 of the original array, and the array outputs 115df have 1602 elements and contains elements 801 to 2402 of the original array. If control 114a has the value two, the array outputs 115ce of 115ab has 1602 elements and contains elements 0 to 1601 of the original array, and the array outputs 115df contains 801 elements and contains elements 1602 to 2402 of the original array. Each of the original arrays 104ab are split to insert measurement data into corresponding element locations.

The array outputs 115df of 115ab go to index array functions 116ab, respectively, that provide index arrays starting at element 801 of arrays 115df defined by inputs 117ab and continuing to the end of the arrays 115df designated by inputs 117cd. The outputs of index functions 116ab go into the lower inputs of build array functions 118ab. The outputs of 118ab, respectively, contain amplitude and phase A, B and C measurement data of a total of 2403 elements of output arrays communicated to outputs 109ab through tunnels 112ab. The upper inputs 115ce of build functions 118ab are from split functions 115ab. The middle inputs 119ab of build array functions 118ab come from an S21 read function 119. The function 119 requests string data from the VNA and accepts the string data representing S21 magnitude and phase measurement data, and converts this measurement data into amplitude data in dB at output 119a and phase data in degrees at output 119b. The constant 120, which has a value of four, merely sets up the S21 read function 119 for 801 points of data.

The tunnel outputs 112b and 113b of build functions 118ab are each an array of 2403 elements of amplitude and phase S21 measurement data. The position of the 801 loaded elements is either elements 0–800, 801–1601, or 1602–2402 depending on whether input 114a has the value zero, one, or two for the three respective A, B and C measurements. The measurement loop 105 iterates three times for the A, B and C measurements 50, 52, and 54. Each time a new test configuration has been set up, input 114a is set to the corresponding value, then start a measurement control 111 is toggled to true, to cause the VNA to take a measurement and write measurement data into the arrays 118ab as outputs 109ab. After all three A, B and C measurements 50, 52, and 54 have been completed, input 106 is toggled to true, and then the measurement data flows into the analysis loop 122 shown in FIG. 7b.

The analysis loop 122 is a software implementation of calculation step 56 in FIG. 2. The calculation step 56 is the SSB response RDUT(f), $R_{DUT}(f)=[R_A(f)+R_B(f)-R_C(f)]/2$. $R_X(f)$ is either an amplitude or phase response from the measurement $M_x(f)$ which includes both amplitude and phase data. The build functions 118ab provide, at the end of all three measurements, an amplitude array at tunnel 112b and phase array of tunnel 113b. Each array has three portions of 801 elements for each respective A, B and C measurement.

In calculation step 56, the RDUT equation contains a factor of ½. The analysis loop 122 multiplies the array inputs 109ab by 0.5 using inputs 123ab and multipliers 124ab. The output arrays of multipliers 124ab are then split into three equal parts by splitters 125ab and 127ab using inputs 126ab and 128ab which result in two sets, amplitude and phase, of three arrays of 801 elements each of A, B and C measurement data. The first A measurement array 125cd of splitters 125ab contain elements 0–800. The second B measurement array 127cd from the splitters of 127ab contain elements 801–1601. The third C measurement array 127ef from the splitters 127ab, contains elements 1602–2402. These two amplitude and phase sets of three A, B and C arrays 125c, 127c, 127e and 125d, 127d, 127f are fed into a case structure 129a, 129b, or 129c, respectively, shown in FIGS. 7b, 7c, and 7d. Each case structure 129abc implements the additions and subtractions of the RDUT equation. Case 129a adds $R_A$ and $R_C$ and subtracts $R_B$ to provide the response of mixer TM1. Case 129b adds $R_B$ and $R_C$ and subtracts $R_A$ to provide the response of mixer TM2. Case 129c adds $R_A$ and $R_B$ and subtracts $R_C$ to provide the response of mixer DUT. The additions are done by the add functions 130a–f and the subtractions by the subtract functions 131a–f. The case 129a, 129b, or 129c is selected by the front panel control analysis input 132. The results of the amplitude and phase calculations are displayed by the front panel indicators 133*ab*. The results of the calculations for cases 129*abc* also go into save case structures 134*abc*. The selected case 129*abc* provides a calculation result that can be saved by a front panel save analysis control 135. Case 129*c* implements the equation of step 56 to calculate the response of the DUT. Case 129*a* and 129*b* are optional and used to calculate the response of the test mixers TM1 and TM2 if desired. If 135 is true, then the mixer response of the corresponding case 129*abc*, selected by input 132 is saved to a spreadsheet file by a write to spreadsheet function 136*abc*. Build array functions 137*abc* provide the write functions 136*abc* with an amplitude response array 133*a* and phase response array 133*b*. The boolean constant 138 transposes the two arrays so that amplitude response data is in a first column and phase response data is in a second column. The functions 136*abc* write the calculated amplitude and phase response data file for the DUT, TM1, TM2, respectively.

The SSB method implemented by functions in FIGS. 7*a* to 7*d* can be applied to DSB DUT and test mixers TM1 and TM2. After changing the filters for RF band measurements, the VNA is set to the desired RF band. The A, B and C measurements 50, 52 and 54 are taken across both upper and lower side bands combined as one measurement through a continuous RF band having a LSB and an USB defined by the LO.

Figure 8A:
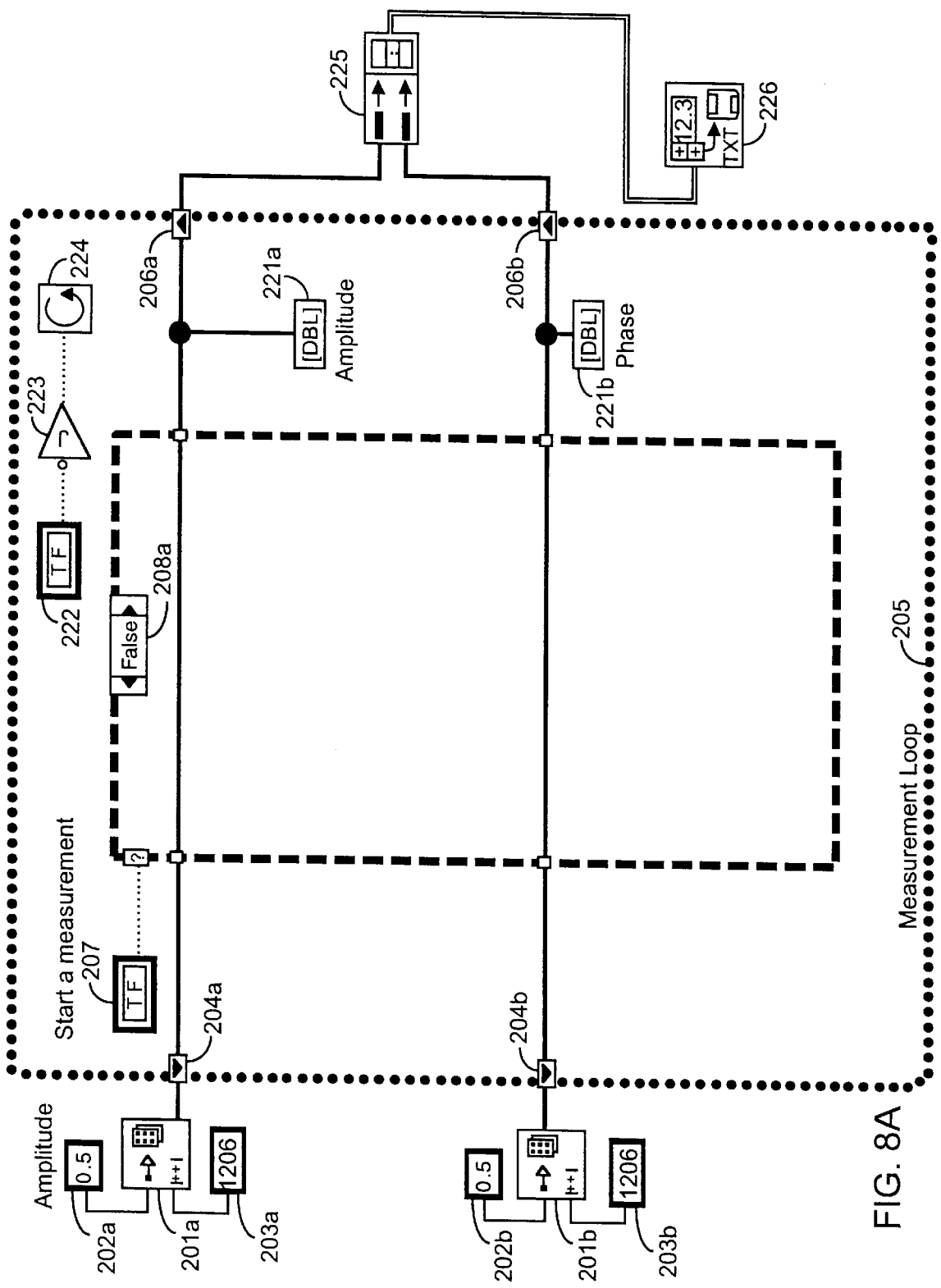
FIGS. 8a–g are DSB test Labview flow diagrams.
Figure 8B:
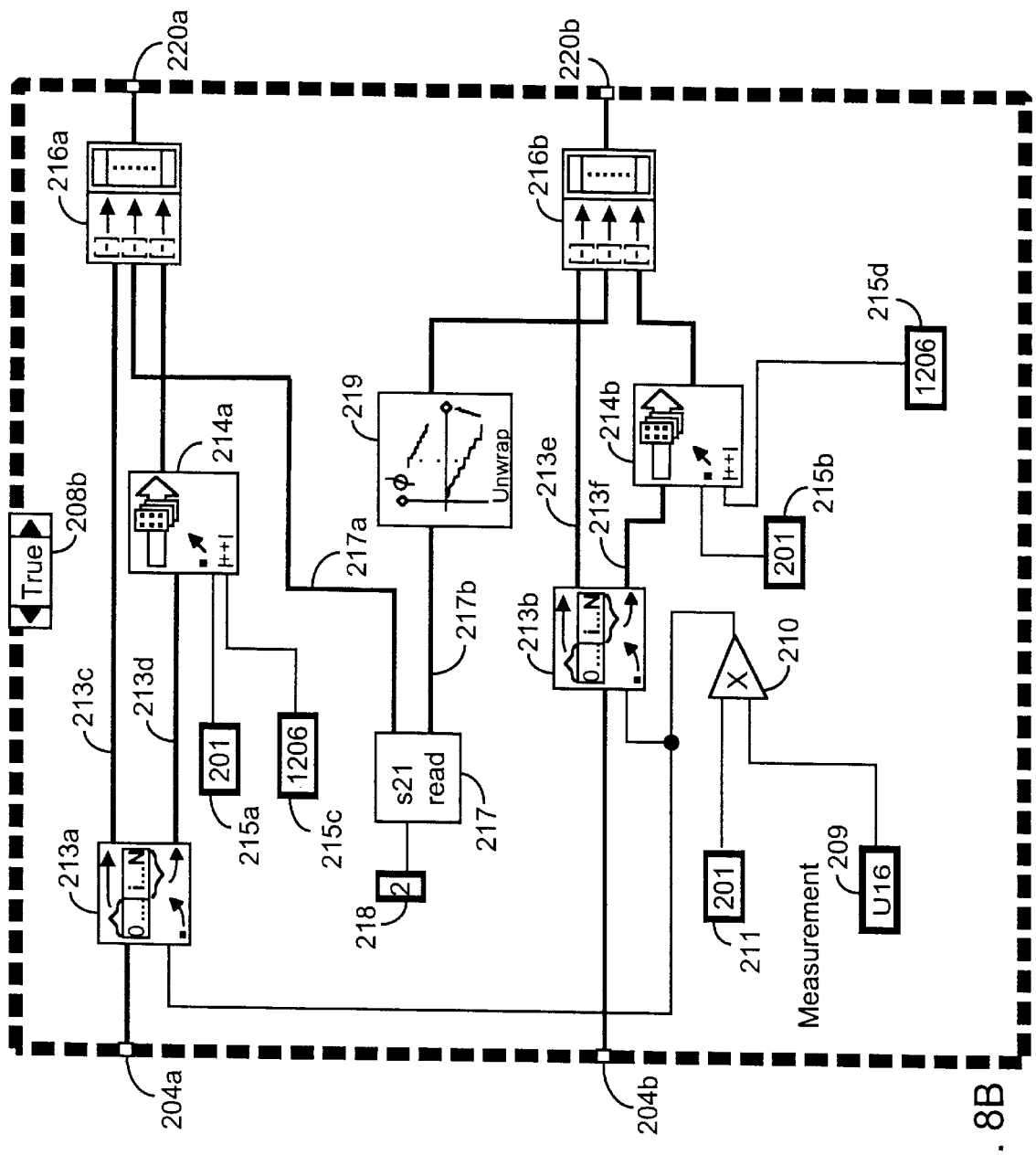

FIGS. 8*a* to 8*g* are block diagrams of Labview functions for implementing the DSB method and collects data over a baseband for a DSB measurement. Referring to FIGS. 8*a* and 8*b*, the DSB method has six measurements, $M_{A\theta}$ $M_{A\theta}'$ $M_{B\theta}$ $M_{B\theta}'$ $M_{C\theta}$ and $M_{C\theta}'$. The measurement loop 205 is setup for 201 points per $M_X$ measurement. The arrays 201*ab* are initialized to 6×201=1206 elements by inputs 203*ab*. The arrays are initialized to a value of 0.5 by inputs 202*ab*. The initialized arrays 204*ab* in the measurement loop 205 feed into output 206*ab*. The array 204*ab* are loaded by shifting data from outputs 206*ab* at the end of an iteration of the loop 205 before the next iteration of the loop 205. A front panel boolean control 207 selects cases 208*ab* through which arrays 204*ab* are fed. Arrays 204*ab* include respective amplitude and phase measurements. If input 207 is false, the case 208*a* is executed as a wait mode, waiting for the operator to set up a hardware configuration. If input 207 is true, the case 208*b* of FIG. 8*b* is executed. The DSB test configuration is shown in FIG. 3 and the DSB test method is shown in FIG. 4. Each of the first three steps 60, 62, and 64 in FIG. 4 corresponds to two hardware configurations and respective measurements, one with the phase shifter set to $\theta$ and the other with the phase shifter set to $\theta+90$ degrees, that is, $\theta'$. The six measurements are selected by the operator by the front-panel measurement control 209. Inputs 211 and 209 are multiplied by multiplier 210 for splitting the arrays 204*ab*. Two response arrays, an amplitude response array and a phase response array, for each of the six measurements are built by the case 208*b*. First, each input array 204*ab* is 1206 elements long and is split into two parts by splitters 213*ab*. The splitting is used to isolate 201 element blocks of the 1206 element long arrays 204*ab*. The size of the two parts is determined by the value of the measurement control 209 multiplied by multiplier 210 with a value of 201 from input 211 with the vector network analyzer set for 201 points. Input 209 can be zero, one, two, three, four or five so that each part can be 000, 201, 402, 603, 804 or 1005 elements long. 201 data elements are recorded for each of the six measurements. First parts 213*df* of each array is fed to the index array functions 214*ab* which serve to discard the first 201 points of these first parts 213*df*. The measurement data will be recorded into the discarded 201 elements of the first parts. For example, when input 209 is 3, elements 603 to 803 are cleared for new measured data. Index function 214*ab* have inputs 215*ac* both with a value of 201 and inputs 215*bd* both with a value of 1206. Function 214*ab* provide unchanged data of the first parts of the array from splitters 213*ab*. Splitter outputs 213*ce* provide unchanged second parts. Splitter outputs 213*df* provide unchanged first parts. The second part of output 213*ce* of each array go unchanged to the upper input to build array functions 216*ab*. The middle inputs to functions 216*ab* accept the S21 measurement data into the discarded 201 elements with the remaining 1005 elements unchanged. Function 216*a* receives amplitude information of dimensionless transmission coefficients. Function 216*b* receives phase information in radians. Both the phase and amplitude information come from the S21 read function 217. The amplitude of output 217*a* is in dimensionless transmission coefficients and not in dB, and the phase of output 217*b* is in radians and not in degrees. The value two of input 218 fed into read function 217 indicates that the VNA is set up for a 201 point sweep. The phase data 217*b* goes through the phase unwrap function 219 to remove phase jumps where the phase goes from $-\pi$ to $+\pi$, or $+\pi$ to $-\pi$.

Measurement case 208*b* in FIG. 8*b* is repeated six times for all Six $M_{A\theta}$ $M_{A\theta}'$ $M_{B\theta}$ $M_{B\theta}'$ $M_{C\theta}$ and $M_{C\theta}'$ measurements indicated in FIG. 4. Each measurement provides measurement data inserted into the discarded portion of the first parts while the remaining five portions are unchanged. The measurement that is being performed is selected by the operator using the front panel measurement control 209. Control 209 can take on values from zero, one, two, three, four and five for the six measurements $M_{A\theta}=0$, $M_{A\theta}'=1$, $M_{B\theta}=2$, $M_{B\theta}'=3$, $M_{C\theta}=4$, and $M_{C\theta}'=5$. After all six measurements, all six 201 element portions of the 1206 element arrays are loaded with new measurement data. The arrays output of tunnels 220*ab* are then organized with $M_{A\theta}$ occupying elements 0 to 200 of each of the two arrays, $M_{B\theta}$ occupying elements 201 to 401, $M_{C\theta}$ occupying elements 402 to 602, $M_{A\theta}'$ occupying elements 603 to 803, $M_{B\theta}'$ occupying elements 804 to 1004, $M_{C\theta}'$ occupying elements 1005 to 1205. After output through the tunnels 220*ab*, the amplitude and phase arrays are fed back to the measurement loop 205 where the arrays are communicated to outputs 206*ab*. The amplitude and phase array data is also displayed graphically on the front panel 221*ab* for operator information. After all six measurements, the boolean front panel control 222 is switched from false to true. This is inverted by inverter 223, so that the loop control 224 reads a false state and will stop the loop 205 before another iteration can occur. After all six measurements are taken, the amplitude and phase arrays at output 206*ab* are communicated to the build array function 225 which puts the amplitude array into a first row, and the phase array into a second row. These DSB measurement arrays are then stored as a spreadsheet file by using spreadsheet function 226. The file name must be specified by the operator by means of a dialog box that pops up when the Labview program is run.

Figure 8C:
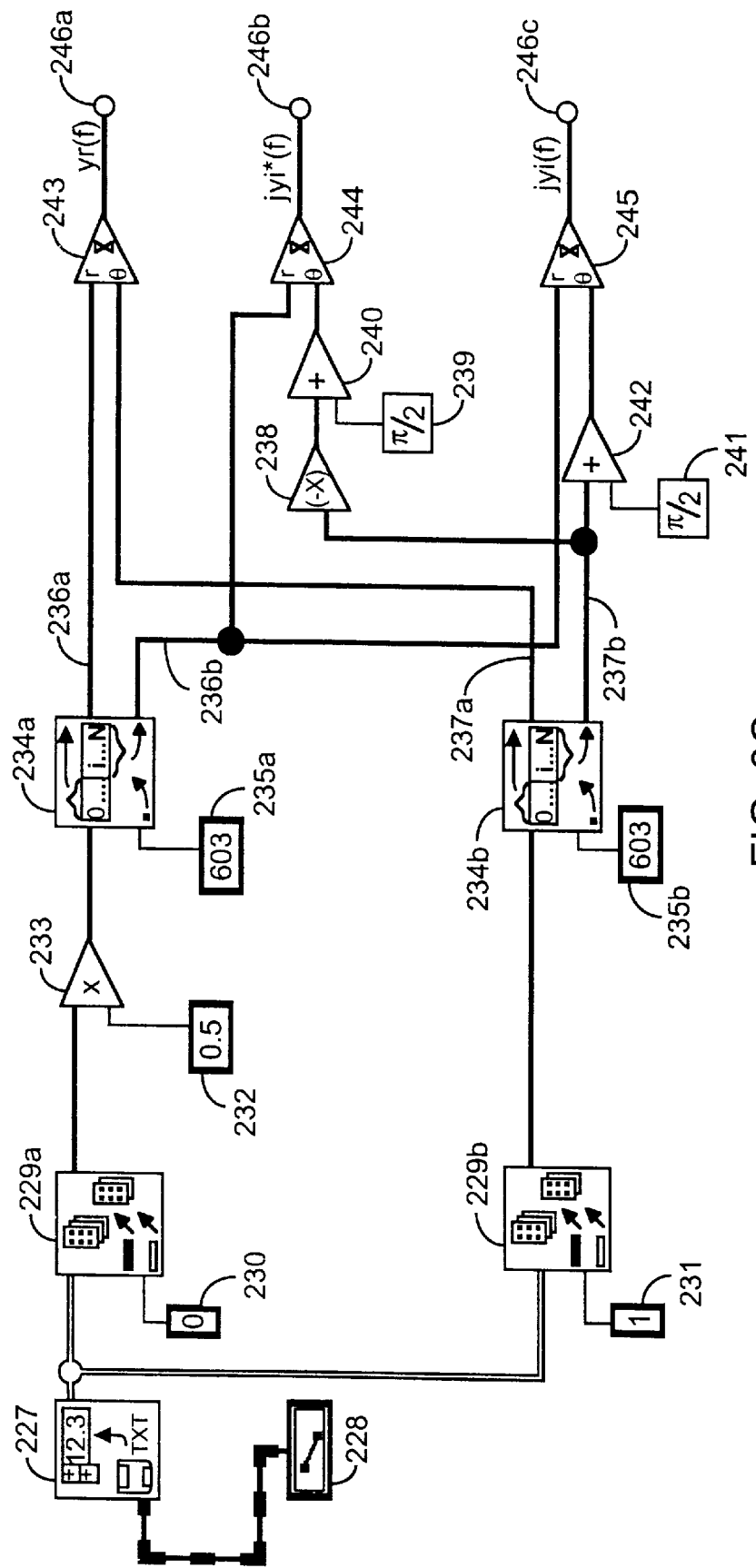
Figure 8D:
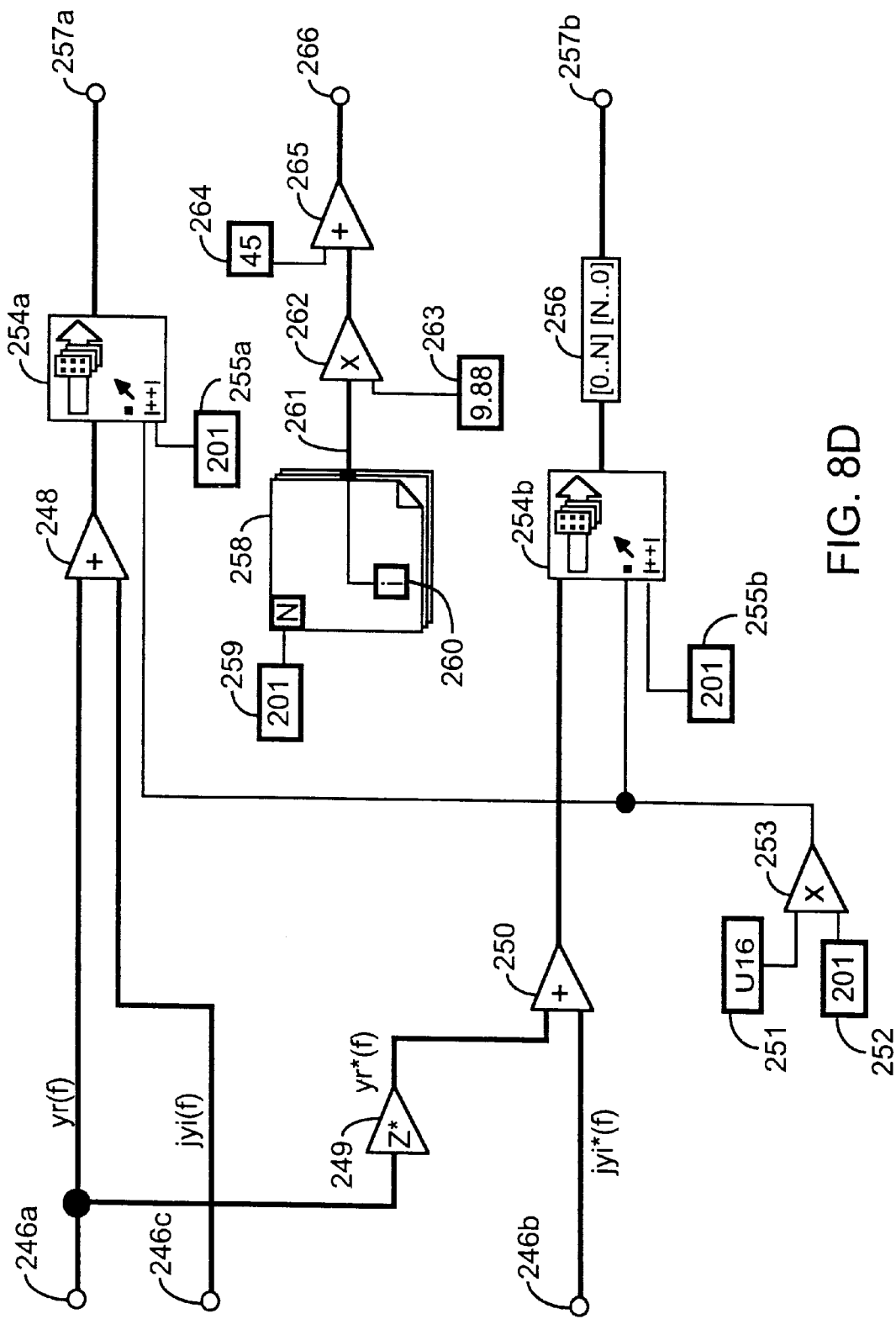
Figure 8E:
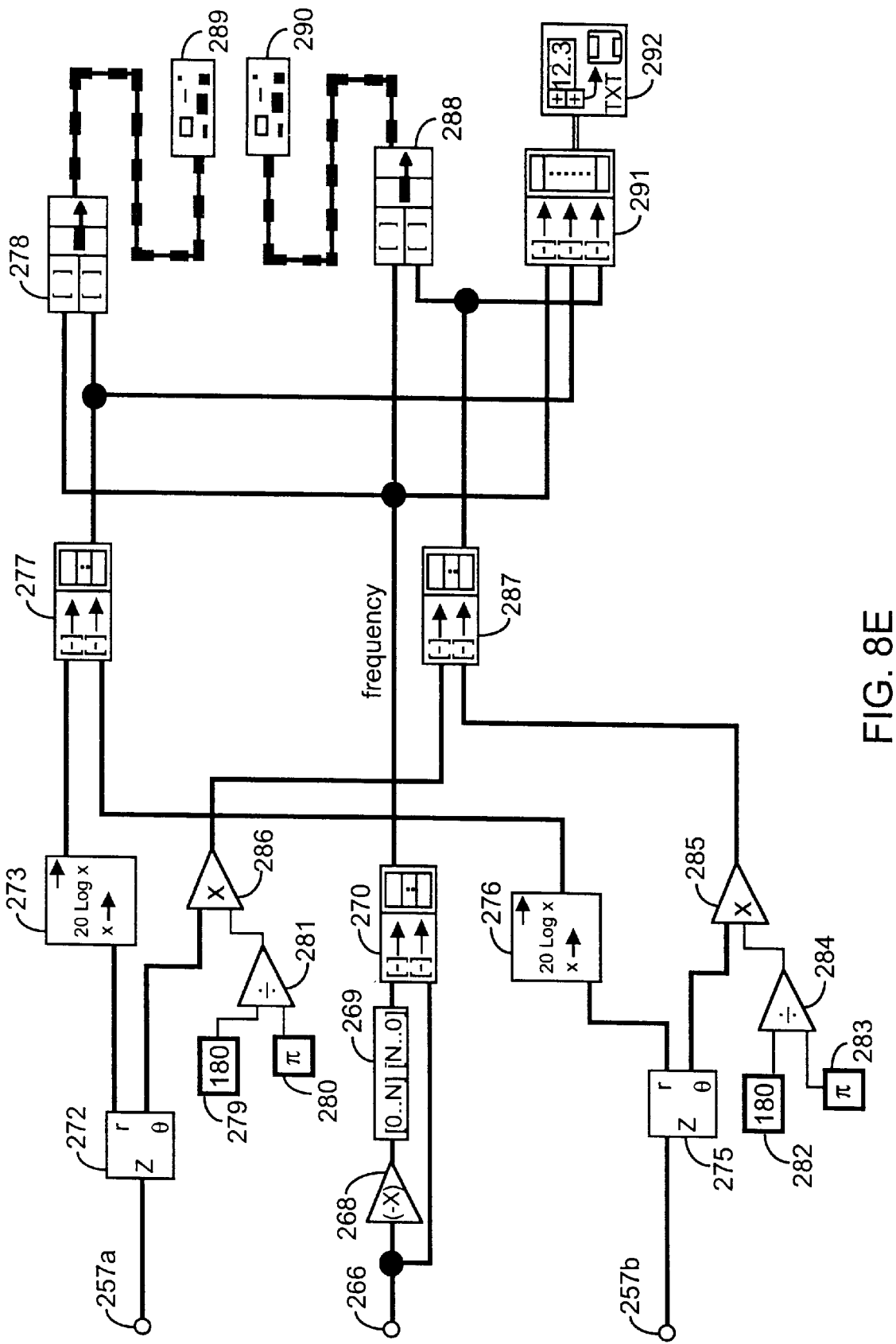

The de-embedding calculations are implemented by functions of FIGS. 8*c*, 8*d* and 8*e*. The operator selects the stored measured data by specifying the file name. The functions of FIGS. 8*c*, 8*d*, and 8*e* convert the two DSB measurement arrays into calculated amplitude and phase frequency responses for both the LSB and USB. The de-embedding equations of steps 60, 62 and 64 of FIG. 4 are used to calculate LSB and USB responses.

Referring to FIG. 8*c*, the file name is specified by selector 227 for the file containing the DSB measurement arrays. The filename appears on the front panel by means of the front panel indicator 228. The DSB measurement arrays consist of one row having amplitude data and another row having phase data, each row having 1206 elements of six measurements each 201 elements long. The DSB measurement arrays are separated by the index array functions 229$ab$. The number zero of input 230 selects the amplitude array. The number one of input 231 selects the phase array. The amplitude data is multiplied by 0.5 from input 232 by multiplier 233 for implementing the equations of steps 60, 62 and 64 of FIG. 4 that have a factor of ½. The split array functions 234$ab$ serve to split each array of 1206 elements into two arrays of 603 elements each using input 235$ab$. The arrays 236$ab$ contain the measurements $M_{A\theta}$, $M_{B\theta}$ and $M_{C\theta}$ while the arrays 237$ab$ contain the measurements $M_{A\theta}'$, $M_{B\theta}'$, and $M_{C\theta}'$. The array 237$b$, containing the phase information for $M_{A\theta}'$, $M_{B\theta}'$, and $M_{C\theta}'$, are multiplied by $-1$ by multiplier 238, and has $\pi/2$ added to it by input 239 using adder 240. Adding $\pi/2$ to the phase is the same as multiplying by the imaginary j. Multiplying the phase by $-1$ implements the complex conjugate operation. Input 241 and adder 242 also add $\pi/2$ to the phase of $M_{A\theta}'$, $M_{B\theta}'$, and $M_{C\theta}'$. The complex function 243 converts the $M_{A\theta}/2$, $M_{B\theta}/2$, and $M_{C\theta}/2$ amplitude and phase data into one array 603 elements long, containing complex numbers representing both amplitude and phase at output 246$a$. The complex function 244 converts the amplitude and phase of $M_{A\theta}'/2$, $M_{B\theta}'/2$, and $M_{C\theta}'/2$, with the phase multiplied by $-\pi/2$. The output 246$b$ of function 244 is $jM_{A\theta}'^*/2$, $jM_{B\theta}'^*/2$, or $jM_{C\theta}'^*/2$ where * denotes the complex conjugate. Similarly, the output 246$c$ of complex function 245 is $jM_{A\theta}'/2$, $jM_{B\theta}'/2$ or $jM_{C\theta}'/2$. The complex functions 243, 244, and 245 have yr(f), jyi*(f), and jyi(f) outputs 246$abc$ shown as inputs to FIG. 8$d$.

Referring to FIG. 8$d$, adder 248 adds the complex arrays of $M_{A\theta}/2$, $M_{B\theta}/2$, or $M_{C\theta}/2$ and $jM_{A\theta}'/2$, $jM_{B\theta}'/2$, or $jM_{C\theta}'/2$ to arrive at $M_{A\theta}/2+jM_{A\theta}'/2$, $M_{B\theta}/2+jM_{B\theta}'/2$, or $M_{C\theta}/2+jM_{C\theta}'/2$. The complex conjugate function 249 computes the complex conjugate of $M_{A\theta}/2$, $M_{B\theta}/2$, $M_{C\theta}/2$, to output $M_{A\theta}^*/2$, $M_{B\theta}^*/2$, or $M_{C\theta}^*/2$. Add function 250 adds $M_{A\theta}^*/2$, $M_{B\theta}^*/2$, or $M_{C\theta}^*/2$ and $jM_{A\theta}'^*/2$, $jM_{B\theta}'^*/2$, or $jM_{C\theta}'^*/2$ to arrive at $M_{A\theta}^*/2+jM_{A\theta}'^*/2$, $M_{B\theta}^*/2+jM_{B\theta}'^*/2$, or $M_{C\theta}^*/2+jM_{C\theta}'^*/2$. Input 251 is a front panel control that can have the values zero, one or two for the A, B or C measurements. Input 251 is multiplied by 201 using input 252 and multiplier 253 having an output fed into array subset functions 254$ab$ which select a portion of the arrays of adders 248 and 250. Each portion is 201 elements long using inputs 255$ab$. If input 251 is zero, then subset function 254$a$ selects $M_{A\theta}/2+jM_{A\theta}'/2$. If input 251 is one, subset function 254$a$ selects $M_{B\theta}/2+jM_{B\theta}'/2$. If input 251 is two, subset function 254$a$ selects $M_{C\theta}/2+jM_{C\theta}'/2$. If input 251 is zero, subset function 254$b$ selects $M_{A\theta}^*/2+jM_{A\theta}'^*/2$. If input 251 is one, subset function 254$b$ selects $M_{B\theta}^*/2+jM_{B\theta}'^*/2$. If input 251 is two, subset function 254$b$ selects $M_{C\theta}^*/2+jM_{C\theta}'^*/2$. A reverse array function 256 serves to convert $[M_{ABC\theta}^*(f)+jM_{ABC\theta}'^*(f)]/2$ at output 257$b$ into $[M_{ABC\theta}^*(-f)+jM_{ABC\theta}'^*(-f)]/2$. Subset function 254$a$ provides $M_{ABC\theta}/2+jM_{ABC\theta}'/2$ at output 257$a$. Output 257$a$ is the $M_x^{USB}$ calculated response and output 257$b$ is the $M_x^{LSB}$ calculated response, both uncorrelated to frequency.

The amplitude and phase arrays of outputs 257$ab$ are to be correlated to frequency points through the baseband. The loop 258 iterates 201 times using input 259, producing an array consisting of 201 elements having respective values 0–200 using a loop counter 260. The tunnel 261 indexes this array. This array is multiplied by 9.88 of input 263 using multiplier 262. The value 9.88 is used because the VNA preferably sweeps from 45 MHz to 2.031 GHz, with 201 points in the exemplar configuration, a span of 1976 MHz, with 9.88 MHz between two successive frequency points. The value of 45 from input 264 is then added by adder 265 to each element of this frequency array providing an output 266. The output 266 is a frequency array of 201 elements with values from 45 at element 000 to a value of 2031 at element 200.

Referring to FIG. 8$e$, the frequency of each of the 201 VNA frequency points is located by MHz. Output 266 is an USB frequency array from which is created a LSB frequency array. The USB frequency array is from 45 MHz to 2031 MHz with 201 equal spaced elements of frequency points. The output 266 feeds into multiplier 268 which multiplies the array of frequency points by $-1$. Inverter 269 inverts the array to provide the LSB frequency array. The build function 270 builds a complete frequency array from the LSB and USB frequency arrays. The build function 270 provides the complete frequency array of 402 elements from $-2031$ MHz up to $-45$ MHz in 201 equally spaced elements for the LSB frequency points, then skipping to $+45$ MHz, and then from $+45$ MHz up to $+2031$ MHz also in 201 equally spaced elements for the USB frequency points. The skipping is required because the HP 8510C VNA has a minimum lower frequency of 45 MHz.

The output 257$a$ feeds the USB array $M_{ABC\theta}/2+jM_{ABC\theta}'/2$ to converter 272 which converts the array from a complex array into a magnitude USB array and a phase USB array. Log function 273 converts the USB magnitude array into dB. Output 257$b$ feeds the LSB array $M_{ABC\theta}^*/2+jM_{ABC\theta}'^*/2$ to converter 275 which converts the LSB array from a complex array into a LSB magnitude array and a LSB phase array. Log function 276 converts the LSB magnitude array into dB. The build function 277 builds the two USB and LSB magnitude arrays into one long amplitude array representing the lower and upper sideband amplitude responses in dB. This long amplitude array is combined with the frequency array from build function 270 using a bundle function 278 forming the DSB amplitude versus frequency response. The USB and LSB phase arrays, respectively, from converters 272 and 275 are in radians. The radian output from converter 272 is converted to degrees using the 180° input 279 and the $\pi$ input 280 of divider 281 providing a 180/$\pi$ output multiplied by the radian output using multiplier 286 providing a USB phase array in degrees. Likewise, the radian out from converter 275 is converted to degrees using the 180° input 282 and the $\pi$ input 283 of divider 284 providing a 180/$\pi$ output multiplied by the radian output using multiplier 285 providing the LSB phase array in degrees. The lower sideband and the upper sideband phase arrays are built into one long phase array by a build function 287. This long phase array is combined with the frequency array from build function 270 using a bundle function 288 forming the DSB phase versus frequency response. The bundled DSB amplitude versus frequency response from bundle function 278 is displayed by the front panel graph 289. The bundled phase versus frequency response from bundle function 288 is displayed by the front panel graph 290. The build array function 291 accepts as inputs the frequency array from build function 270, the amplitude response from build function 277, and the phase response from build function 281. Build function 291 builds a DSB response array with frequency, amplitude and phase in rows zero, one, and two, respectively. The DSB response array is stored in a file by spreadsheet file function 292 by file name. The functions of FIGS. 8$c$, 8$d$, and 8$e$ are executed for each of the steps 60, 62, and 64 for each value zero, one or two of control 251.

The control 251 must have a different value, either zero, one, or two and a different filename into which each DSB A, B or C response is stored. The file contains $M_A^{LSB}(f)$ and $M_A^{USB}(f)$ if 251 is zero, or the file contains $M_B^{USB}(f)$ and $M_B^{USB}(f)$ if 251 is one, or the file contains $M_C^{LSB}(f)$ and $M_C^{USB}(f)$ if 251 is two. All three A, B and C DSB response files are used to calculate the RDUT response of step 66.

Figure 8F:
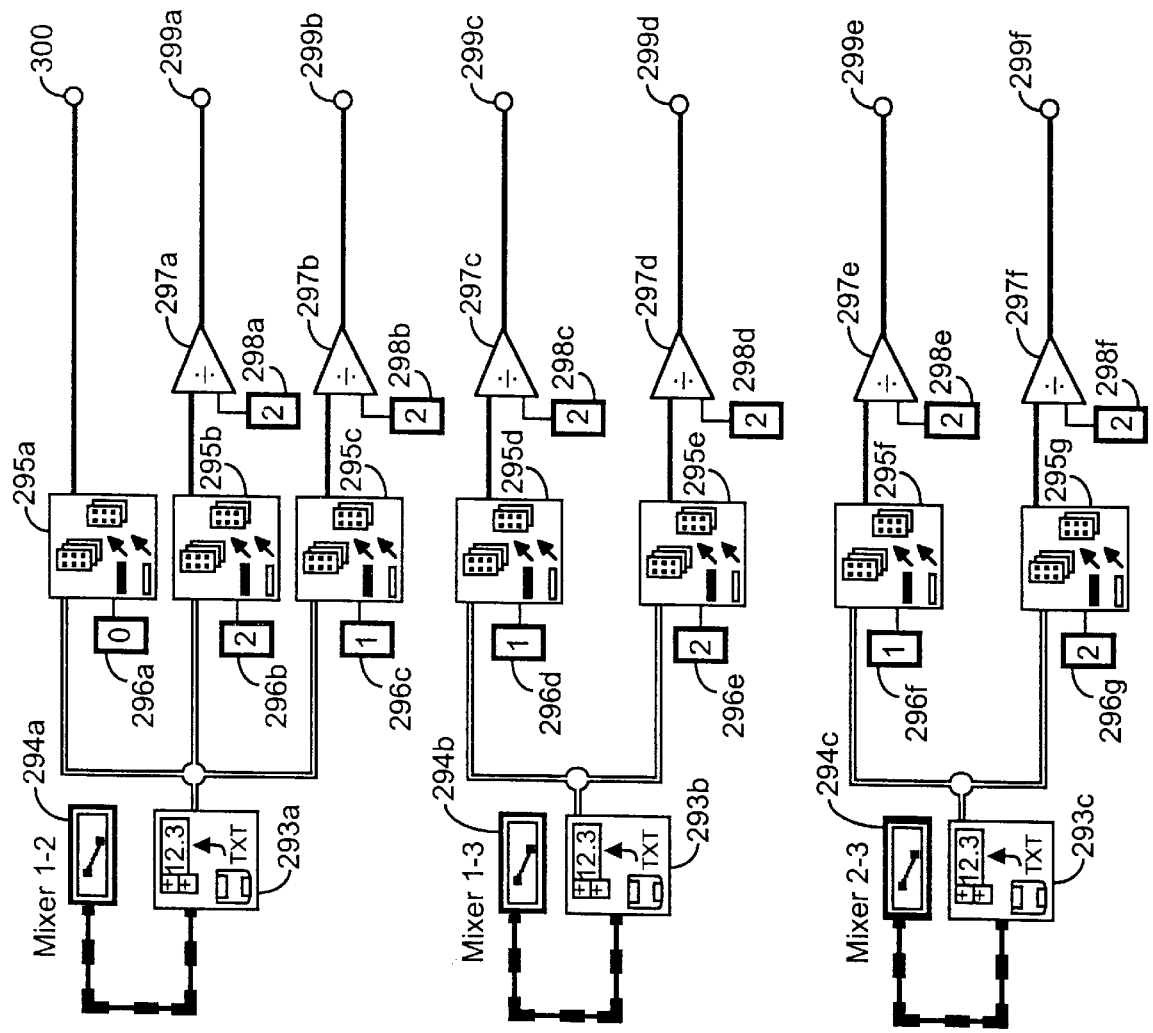
Figure 8G:
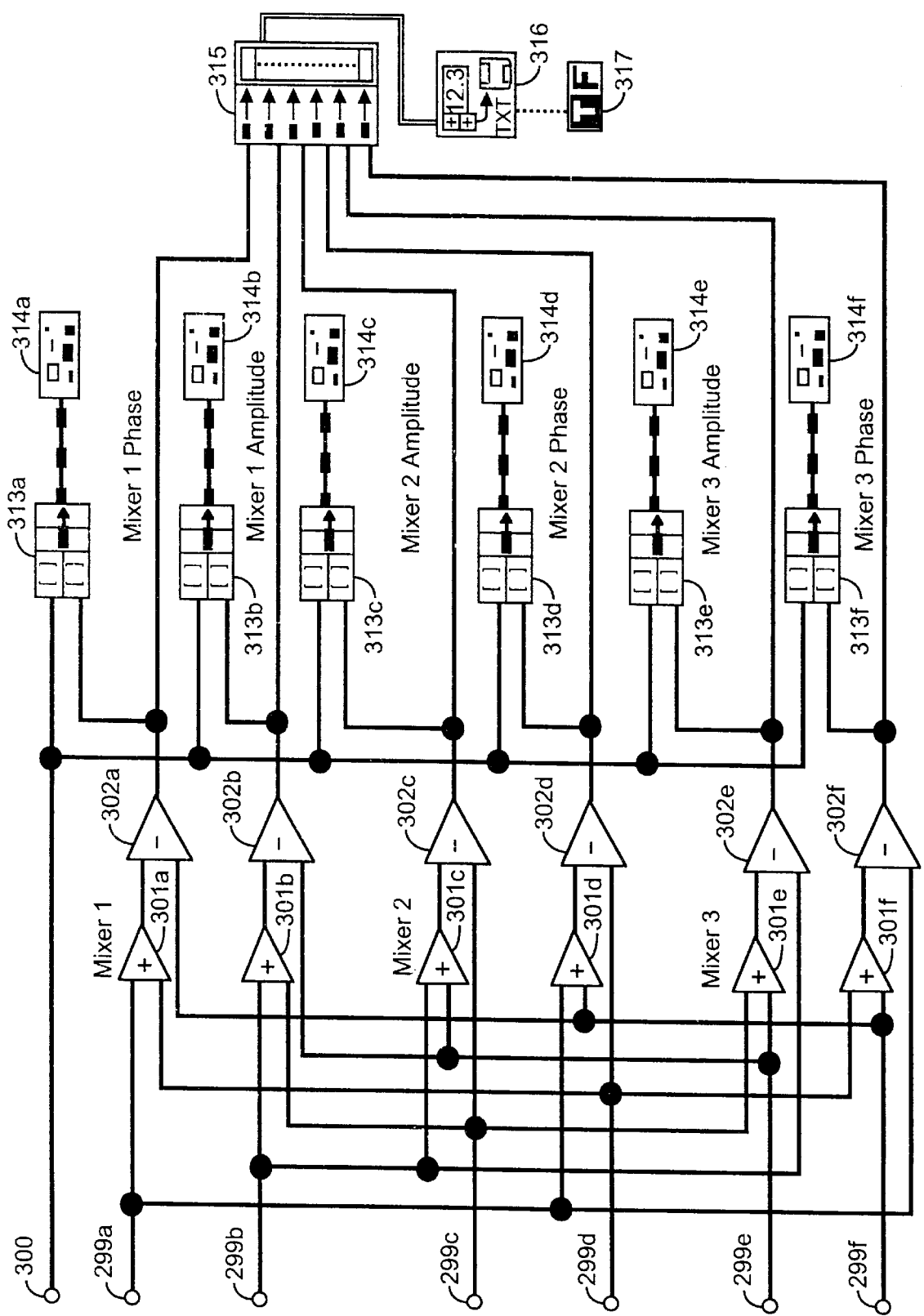

The functions of FIGS. 8f and 8g calculate the RDUT response from the three DSB response files. The equations implemented by these functions are given in step 66 of FIG. 4. Converters 293abc are spreadsheet file to array converters. The three DSB response data files are selected from storage by selectors 294abc. Selector 294abc indicates the respective file name of the three DSB response files stored by the spreadsheet function 292. Selector 294a contains the $M_A^{LSB}(f)$ and $M_A^{USB}(f)$ filename. Selector 294b contains the $M_B^{LSB}(f)$ and $M_B^{USB}(f)$ filename Selector 294c contains the $M_C^{LSB}(f)$ and $M_C^{USB}(f)$ filename.

The DSB amplitude, phase and frequency response files are arrays containing frequency in row zero, amplitude in dB in row one, and phase in degrees in row two. Index array functions 295a–g select frequency, amplitude, or phase depending on whether the respective index input 296a–g has the value zero, one, or two, respectively. The phase and amplitude arrays are respectively divided by dividers 297a–f by the value two from inputs 298a–f indicated by step 66 of FIG. 4. The frequency array is provided on output 300. The divider outputs 299a–f feed into the inputs of add functions 301a–f and the subtract function 302a–f to implement the two equations in step 66 calculate for the RDUT amplitude and phase response. The add functions 301a–f and subtract functions 302a–f implement the step 66 equations for DUT, TM1 and TM2 amplitude and phase responses. Bundle functions 313a–f bundle together the frequency array output 300 with either the amplitude arrays 299bce or phase arrays 299adf information 299a–f for each of the three mixers. The frequency correlated amplitude and phase responses 313a–f are displayed by the front panel graphs 314a–f. Graph 314a displays DUT phase versus frequency. Graph 314b displays DUT amplitude versus frequency. Graph 314c displays TM1 amplitude versus frequency. Graph 314d displays TM2 phase versus frequency. Graph 314e displays graph TM2 amplitude versus frequency. Graph 314f displays TM2 phase versus frequency. All six DSB calculated responses are then combined by the build array function 315 which created an array with six rows. Row zero contains the phase response of the DUT. Row one contains the amplitude response of the DUT. Row two contains the amplitude response of TM1. Row three contains the phase response of TM1. Row four contains the amplitude response of TM2. Row five contains the phase response of TM2. This six row array is stored in a spreadsheet file by spreadsheet function 316. A boolean constant 317 serves to transpose the rows to columns before storage, so that the data is in columns rather than rows, for ease of manipulation in a spreadsheet program.

Figure 7A:
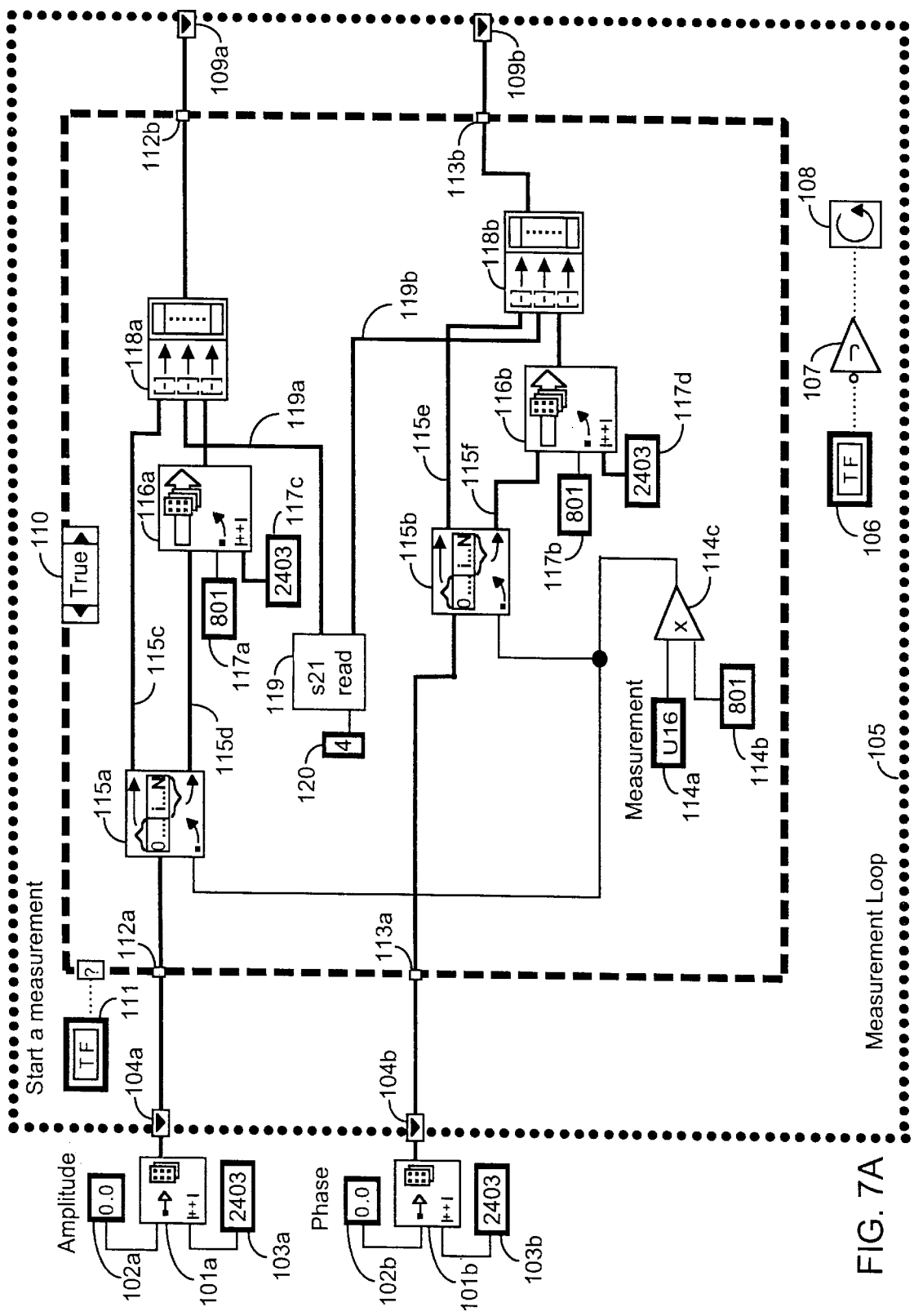
FIGS. 7a–d are SSB test Labview flow diagrams.
Figure 7B:
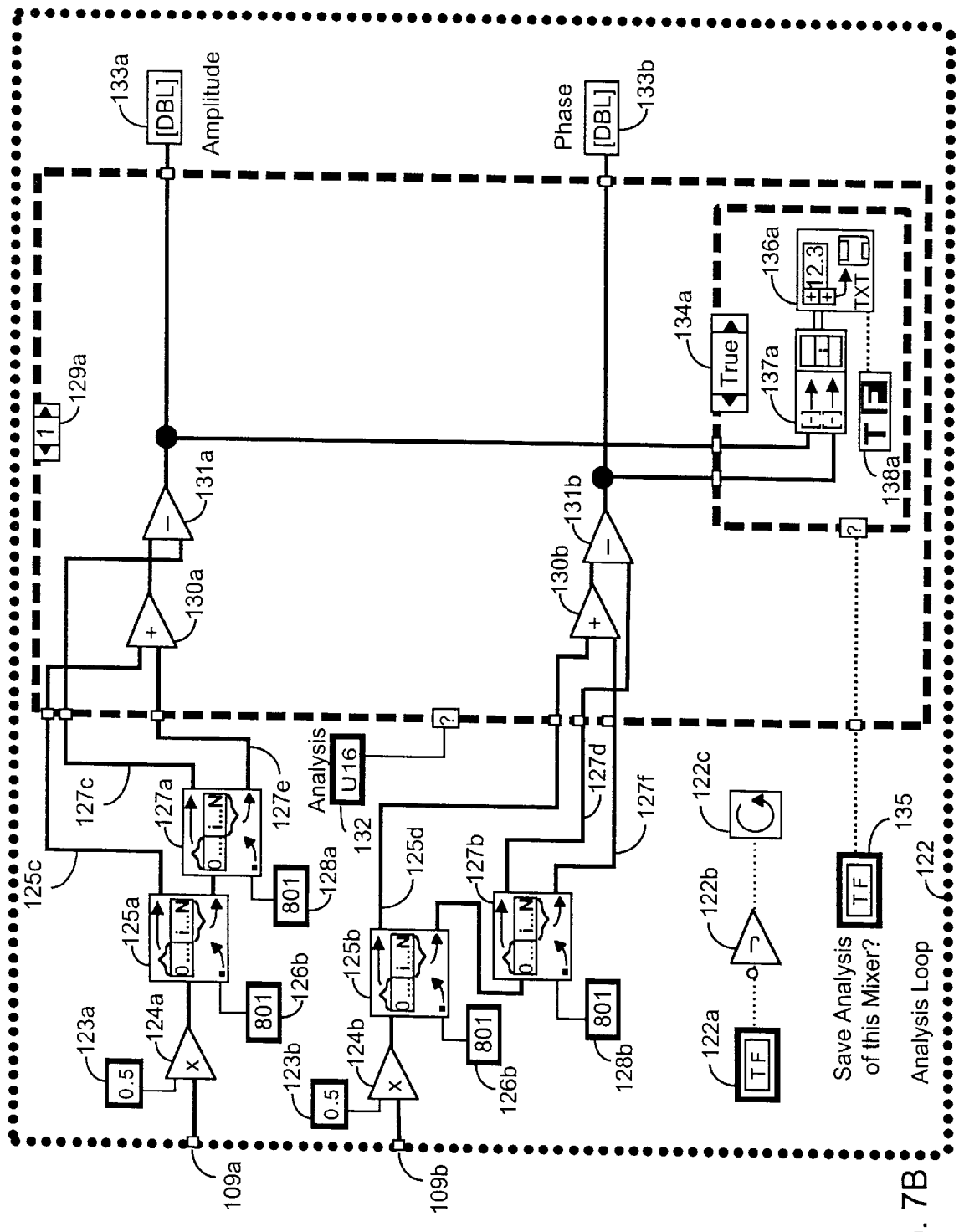
Figure 7D:
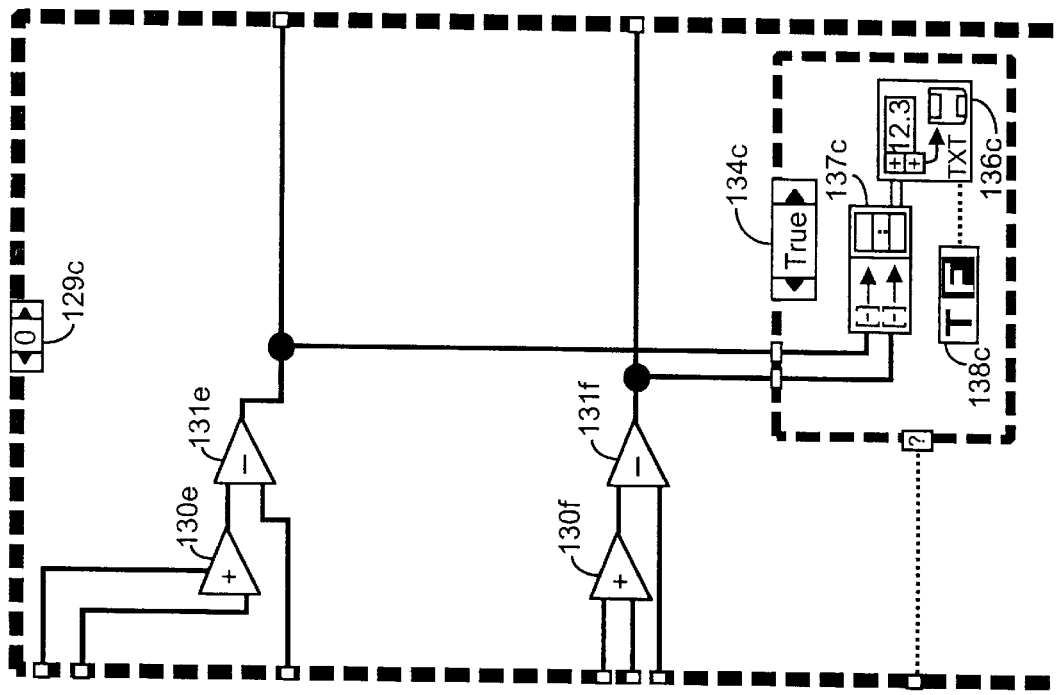
Figure 7C:
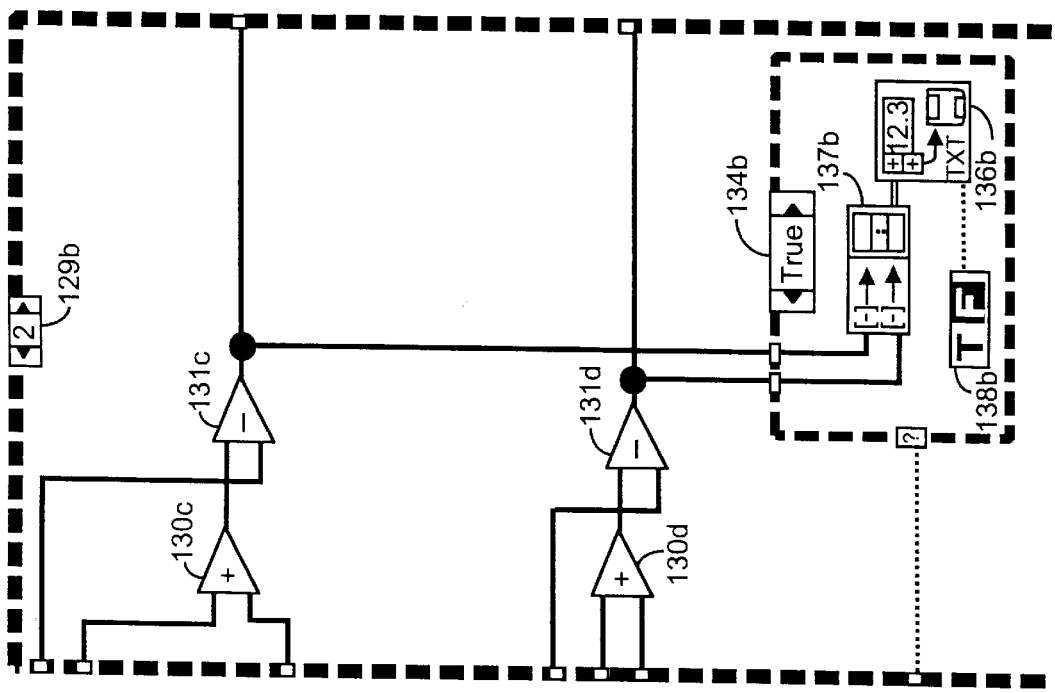
Figures 9A, 9B:
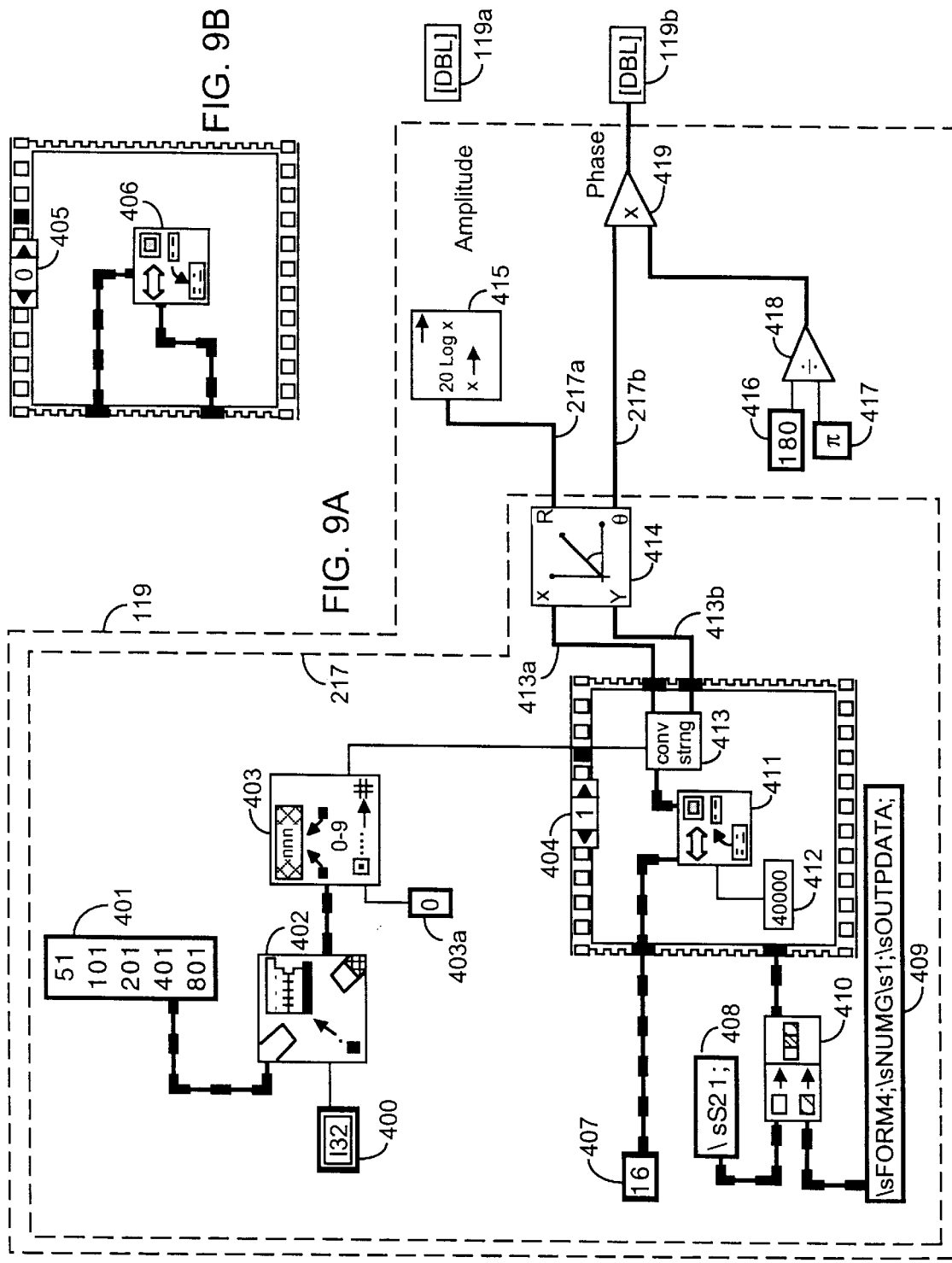
FIGS. 9a–c are VNA test Labview flow diagrams.

Referring to FIGS. 9a and 9b, the read S21 function 119 and 217 shown in FIGS. 7a and 8b are shown in detail. Input 400 is a front panel control that corresponds to input 120 in FIG. 7a with a value of four or corresponds to input 218 in FIG. 8b with a value of two. The value of input 400 is for selecting an element value in an array 401 of element values. The input 400 and array 401 feed into the append function 402. If input 400 has the value two, then function 402 selects the 201 line in array 401. The 201 line out of function 402 is a string, not a number, but is converted to the number 201 by converter 403. The converter 403 provides a value of the number of data elements to be acquired during a measurement sweep. The converter 403 communicates the value of the number of data points to read sequence loop 404 but not write sequence 405.

Sequence loop 405 contains a GPIB write function 406 to write a command to the VNA address sixteen on the General Purpose Interface Bus (GPIB) address bus 407. The command sent to the VNA is contained in an S parameter command 408 and an output command 409 which are combined into one long command string by the concatenate string function 410. The command 409 is specific to the HP 8510 VNA and commands the VNA to perform S21 measurement sweeps and to output the sampled S21 data.

The sequence loop 404 contains a GPIB read function 411. The read function 411 reads the output S21 data from the VNA which is at address 16 specified by string 407. The byte count 412 has a value of 40,000 adequate to contain the 201 points of S21 data. The VNA outputs the S21 data as a string. The 201 elements of data in the form of a string go into the string converter 413. The string converter 413 converts the VNA S21 data string into two arrays of numbers, one containing the real part 413a of the S21 measurements, the other containing the imaginary part 413b of the S21 measurement. The real and imaginary arrays 413ab are converted into amplitude and phase by complex function 414 having outputs 217ab. The read S21 function 217 in FIG. 8b has array outputs 217ab for amplitude and phase. The amplitude array output 217a is in dimensionless transmission coefficients, and the phase array output 217b is in radians. The amplitude array 217a is converted to dB by converter 415. The phase array 217b is converted from radians to degrees by the 180° input 416 and the π input 417 using divider 418 and multiplier 419. This amplitude array output 119a and the phase array output 119b are the outputs of the S21 read function 119 in FIG. 7a.

Figure 9C:
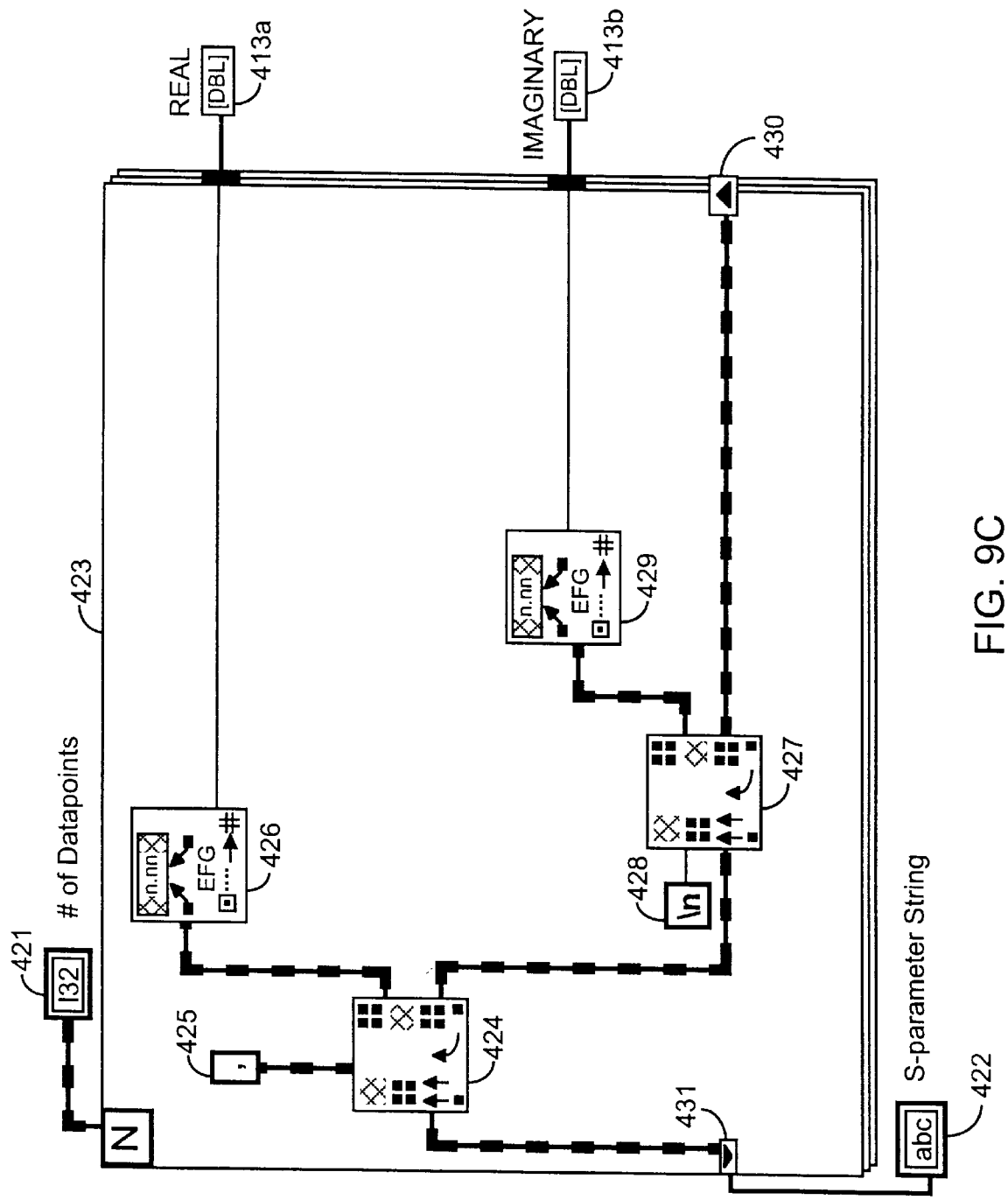

FIG. 9c shows detailed functions of string converter 413 FIG. 9a. An s-parameter string output 422 from the VNA communicates through the GPIB read function 411 and feeds into a converter loop 423 which iterates a number of times determined by the number of data points 421, either 51, 101, 201, 401 or 801, selected by input 400. The string 422 feeds match pattern function 424 which searches for the first instance of a comma defined by input 425, and then splits the string 422 into a first substring before the comma and a second substring after the comma. The first substring before the comma goes into fraction function 426 which converts the first substring into a number, interpreting the first substring as a number which is the real part of the S21 measurement. The output of fraction function 426 is the real part of the S21 measurement. The second substring after the comma is output from match pattern function 424 and fed into match pattern function 427 which searches the second substring for the characters \n indicated by a \n input 428. The second substring is split into a third and fourth substring. The third substring before the \n is output from function 427 and fed into the fraction function 429 which converts the third substring into a number which is the imaginary part of S21 measurement. The fourth substring after the \n is fed into a shift register 430, which feeds back to an input shift register 431 before the next iteration, for each of the 201 iterations needed to convert an S21 sweep measurement. In this way, the real and imaginary parts of the S21 measurement are built up as respective arrays 413ab. After all 201 iterations, the real part of the S21 measurement is output as a real array 413a while the imaginary part is output as an imaginary array 413b. The arrays 413a and 413b are the output of the string converter 413. The real and imaginary arrays 413ab can now be converted to amplitude and phase by converter 414.

The DSB and SSB methods can be used to obtain the transmission response of SSB and DSB FTDs. Those skilled in the art can make enhancements, improvements and modifications to enhance the invention. However, those enhancements, improvements and modifications may nonetheless fall within the spirit and scope of the following claims.

What is claimed is:

1. A method of determining the transmission response of a device under test (DUT), the DUT is a frequency translation device (FTD), the method comprising steps of, measuring a first frequency response of the DUT coupled with a first test device (TD1), the TD1 is an FTD, one of the coupled DUT and TD1 is an up converter FTD and the other one of the coupled DUT and TD1 is a down converter FTD, measuring a second frequency response of the DUT coupled with a second test device (TD2), the TD2 is an FTD, one of the coupled DUT and TD2 is an up converter FTD and the other one of the coupled DUT and TD2 is a down converter FTD, measuring a third frequency response of the TD1 coupled with the TD2, one of the coupled TD1 and TD2 is an up converter FTD and the other one of the coupled TD1 and TD2 is a down converter FTD, one of the TD1 FTD and TD2 FTD has a reciprocal up converter and down converter frequency response, the one FTD is an up converter during one of the first, second or third measurements and is an down converter during another one of the first, second or third measurements, and calculating the transmission response of the DUT from the first, second and third frequency responses.

2. The method of claim 1 further comprising the step of terminating the one FTD to provide the reciprocal frequency response when coupled as either the up converter or the down converter.

3. The method claim 1 wherein, the coupled up converter translates up an IF signal to an RF signal, the coupled down converter translates down the RF signal to the IF signal, and the coupled up and down converters are coupled together to receive the IF signal and to provide the IF signal after up and down frequency translation.

4. The method of claim 3 further comprising the steps of, filtering the RF signal to reduce noise, filtering the IF signal into the up converter to reduce noise, and filtering the IF signal out of the down converter to reduce noise.

5. The method of claim 1 wherein, first, second and third frequency responses each comprise amplitude and phase frequency responses over a frequency bandwidth.

6. The method of claim 1 wherein, the coupled up converter translates up an IF signal to an RF signal, the coupled down converter translates down the RF signal to the IF signal, the coupled up and down converters are coupled together to receive the IF signal and to provide the IF signal after up and down frequency translation, the DUT is an up converter FTD and the TD1 is a down converter FTD during the first frequency response measurement, the DUT is an up converter FTD and the TD2 is a down converter FTD during the second frequency response measurement, the TD1 is an up converter FTD and the TD2 is a down converter FTD during the third frequency response measurement, the TD1 has the reciprocal frequency response, and each of the first, second and third measurements are forward frequency sweeps measurements by providing the IF signal into the up converter and by sampling the IF signal out of the down converter.

7. The method of claim 1 wherein, the coupled up converter translates up an IF input signal to an RF output signal, the coupled down converter translates down the RF output signal to the IF signal, the coupled up and down converters are coupled together to receive the IF signal and to provide the IF signal after up and down frequency translation, the DUT, TD1 and TD2 are single sideband mixers, the up converter receives a local oscillator signal for frequency translation of the IF signal into the RF signal, and the down converter receives a local oscillator signal for frequency translation of the RF signal into the IF signal.

8. The method of claim 1 wherein, the coupled down converter translates down an RF signal to an IF signal, the coupled up converter translates up the IF signal to the RF signal, the coupled down and up converters are coupled together to receive the RF signal and to provide the RF signal after down frequency translation to an IF signal and after up frequency translation to the RF signal, the DUT, TD1 and TD2 are double sideband mixers, the down converter receives a local oscillator signal for frequency translation of the RF signal into the IF signal, and the up converter receives a local oscillator signal for frequency translation of the IF signal into the RF signal.

9. A method of determining the transmission response of a device under test (DUT), the DUT is a frequency translation device (FTD), the method comprising steps of, measuring a first frequency response of the DUT coupled with a first test device (TD1), the TD1 is an FTD, one of the coupled DUT and TD1 is an up converter FTD and the other one of the coupled DUT and TD1 is a down converter FTD, the up and down converters receive a local oscillator signal for frequency translation, repeating the first measurement with the local oscillator signal of one of the up or down converters phase shifted ninety degrees to provide a first repeated frequency response, measuring a second frequency response of the DUT coupled with a second test device (TD2), the TD2 is an FTD, one of the coupled DUT and TD2 is an up converter FTD and the other one of the coupled DUT and TD2 is a down converter FTD, repeating the second measurement with the local oscillator signal of one of the up or down converters phase shifted ninety degrees to provide a second repeated frequency response, measuring a third frequency response of the TD1 coupled with the TD2, one of the coupled TD1 and TD2 is an up converter FTD and the other one of the coupled TD1 and TD2 is a down converter FTD, one of the DUT FTD, TD1 FTD and TD2 FTD has a reciprocal up converter and down converter frequency response, repeating the third measurement with the local oscillator signal of one of the up or down converters phase shifted ninety degrees to provide a third repeated frequency response, the one FTD is an up converter during one of the first, second or third measurements and respective first, second or third repeated measurements and is an down converter during another one of the first, second or third measurements and respective first, second of third repeated measurements, and calculating the transmission response of the DUT from the first, second and third frequency responses and the first, second and third repeated frequency responses.

10. The method of claim 9 wherein, the coupled up converter translates up an IF signal to an RF signal, the coupled down converter translates down the RF signal to the IF signal, the coupled up and down converters are coupled together to receive the IF signal and to provide the IF signal after up and down frequency translation, the DUT, TD1 and TD2 are double sideband mixers, the up converter receives a local oscillator signal for frequency translation of the IF signal into the RF signal, the down converter receives a local oscillator signal for frequency translation of the RF signal into the IF signal.

11. The method of claim 10 wherein, the first measurement and the first repeated measurement are used to calculate a first lower sideband response and a first upper sideband response, the second measurement and the second repeated measurement are used to calculate a second lower sideband response and a second upper sideband response, the third measurement and the third repeated measurement are used to calculate a third lower sideband response and a third upper sideband response, and the transmission response of the DUT is calculated from the first, second and third lower and upper sideband responses.

12. The method of claim 9 wherein the coupled up converter translates up an IF signal to an RF signal, the coupled down converter translates down the RF signal to the IF signal, and the coupled up and down converters are coupled together to receive the IF signal and to provide the IF signal after up and down frequency translation, the first, second and third frequency responses and the first, second and third repeated frequency response each comprise amplitude and phase frequency responses over a frequency bandwidth, the method further comprising the steps of, terminating the one FTD to provide the reciprocal frequency response when coupled as either the up converter or the down converter, filtering the RF signal communicated between the up converter and down converter to reduce noise, filtering the IF signal into the up converter to reduce noise, and filtering the IF signal out of the down converter to reduce noise.

13. A method of determining the transmission response of a device under test (DUT), the DUT is a frequency translation device (FTD), the method comprising steps of, first coupling the DUT to a first test device TD1, one of the coupled DUT and TD1 is an up converter FTD and the other one of the coupled DUT and TD1 is a down converter FTD, the up and down converters are coupled between a first port and a second port, first measuring a first frequency response of the DUT coupled to the TD1 by providing an input signal at the first port and sampling an output signal at the second port, second coupling the DUT to a second test device TD2, one of the coupled DUT and TD2 is an up converter FTD and the other one of the DUT and TD2 is a down converter FTD, the up and down converters are coupled between the first port and the second port, second measuring a second frequency response of the DUT coupled to the TD2 by providing the input signal at the first port and sampling the output signal at the second port, third coupling the TD1 to the TD2, one of the coupled TD1 and TD2 is an up converter FTD and the other one of the TD1 and TD2 FTDs is a down converter FTD, one of the coupled TD1 and TD2 has a reciprocal frequency response, the up and down converters are coupled between the first port and the second port, third measuring a third frequency response of the TD1 coupled with the TD2 by providing the input signal at the first port and sampling the output signal at the second port, and calculating the transmission response of the DUT from the first, second and third frequency responses.

14. The method of claim 13 wherein, the coupled up converter translates up an IF signal to an RF signal, the coupled down converter translates down the RF signal to the IF signal, the coupled up and down converters are coupled together to receive the IF signal and to provide the IF signal after up and down frequency translation, the up converter receives a local oscillator signal for frequency translation of the IF signal into the RF signal, and the down converter receives the local oscillator signal for frequency translation of the RF signal into the IF signal.

15. The method of claim 13 wherein, the first and second ports are coupled to an analyzer controlled by a controller for receiving the frequency responses from the analyzer and for calculating the transmission response of the DUT, the analyzer measures the frequency responses by providing frequency sweeps of the input signal and by sampling the output signal through the frequency sweeps, and the transmission response of the DUT comprise phase and amplitude responses.

16. The method of claim 13, wherein, the coupled up converter translates up an IF signal to an RF signal, the coupled down converter translates down the RF signal to the IF signal, the coupled up and down converters are coupled together to receive the IF signal and to provide the IF signal after up and down frequency translation, the up converter receives a local oscillator signal for frequency translation of the IF signal into the RF signal, the down converter receives the local oscillator signal for frequency translation of the RF signal into the IF signal, the DUT, TD1 and TD2 are double sideband mixers, the first measurement comprises a first zero degree measurement with the local oscillator signal to the down converter phase shifted zero degrees to provide a first zero degree frequency response, and comprises a first ninety degree measurement with the local oscillator signal to the down converter phase shifted ninety degrees to provide a first ninety degree frequency response, the second measurement comprises a second zero degree measurement with the local oscillator signal to the down converter phase shifted zero degrees to provide a second zero degree frequency response, and comprises a second ninety degree measurement with the local oscillator signal to the down converter phase shifted ninety degrees to provide a second ninety degree frequency response, the third measurement comprises a third zero degree measurement with the local oscillator signal to the down converter phase shifted zero degrees to provide a third zero degree frequency response, and comprises a third ninety degree measurement with the local oscillator signal to the down converter phase shifted ninety degrees to provide a third ninety degree frequency response, and the calculating step comprises a calculation of a first lower sideband response and a first upper sideband response from the first zero and ninety degree frequency responses, comprises a calculation of a second lower sideband response and a second upper sideband response from the second zero and ninety degree frequency responses, comprises a calculation of a third lower sideband response and a third upper sideband response from the third zero and ninety degree frequency responses, and comprises a calculation of the transmission response of the DUT from the first, second and third lower and upper sideband responses.

17. The method of claim 13 wherein at least one of the TD1 or TD2 has a reciprocal frequency response and the first and second coupling and measurement steps and the calculating step are repeated for a plurality of times for determining the respective transmission responses of a respective plurality of the DUT.

18. The method of claim 13 wherein an analyzer has the first and second ports between which is coupled the up and down converters, the analyzer provides the input signal at a first port and samples the output signal at a second port, the method further comprising the step of communicating a local oscillator signal to the up and down converters for frequency translation and phase coherence.

19. The method of claim 13 wherein the measurements are amplitude and phase frequency response measurements over a swept frequency range, the method further comprising the steps of band pass filtering over the swept frequency range the analyzer first and second ports to reduce noise, and band pass filtering over a translated frequency range between the coupled up converter and down converter to reduce noise.

20. The method of claim 13 further comprising the steps of, attenuating and filtering the input signal at the first port to reduce noise, attenuating and filtering a translated signal in between the coupled up converter and down converter to reduce noise, and attenuating and filtering the output signal at the second port to reduce noise, the reduction of noise for improving the accuracy of the measurements and the calculation.

* * * * *